(12) United States Patent
Mohsenian-Rad et al.

(10) Patent No.: US 11,211,800 B2
(45) Date of Patent: Dec. 28, 2021

(54) METHOD AND SYSTEM FOR LOCATING THE SOURCE OF EVENTS IN POWER DISTRIBUTION SYSTEMS USING DISTRIBUTION-LEVEL PMU DATA

(71) Applicants: THE REGENTS OF THE UNIVERSITY OF CALIFORNIA, Oakland, CA (US); Lawrence Livermore National Security, LLC, Livermore, CA (US)

(72) Inventors: Hamed Mohsenian-Rad, Riverside, CA (US); Mohammad Farajollahi, Riverside, CA (US); Alireza Shahsavari, Riverside, CA (US); Emma Mary Stewart, Danville, CA (US)

(73) Assignees: THE REGENTS OF THE UNIVERSITY OF CALIFORNIA, Oakland, CA (US); LAWRENCE LIVERMORE NATIONAL SECURITY, LLC, Livermore, CA (US)

( * ) Notice: Subject to any disclaimer, the term of this patent is extended or adjusted under 35 U.S.C. 154(b) by 151 days.

(21) Appl. No.: 16/435,119

(22) Filed: Jun. 7, 2019

(65) Prior Publication Data
US 2019/0379209 A1   Dec. 12, 2019

Related U.S. Application Data

(60) Provisional application No. 62/682,709, filed on Jun. 8, 2018.

(51) Int. Cl.
*H02J 3/46* (2006.01)
*H02J 3/02* (2006.01)
(Continued)

(52) U.S. Cl.
CPC ............ *H02J 3/46* (2013.01); *G01R 19/2513* (2013.01); *H02J 3/02* (2013.01); *H02J 3/1878* (2013.01)

(58) Field of Classification Search
CPC ........ H02J 3/02; H02J 3/18; H02J 3/46; H02J 3/1878; G01R 19/25; G01R 19/2513
(Continued)

(56) References Cited

U.S. PATENT DOCUMENTS

2018/0292447 A1 * 10/2018 Piyasinghe .......... G01R 31/088

OTHER PUBLICATIONS

"Power Systems Computer Aided Design User's Guide", HVDC Research Centre, Canada, 2003, pp. 1-529.
(Continued)

*Primary Examiner* — Hal Kaplan
(74) *Attorney, Agent, or Firm* — Buchanan Ingersoll & Rooney PC

(57) ABSTRACT

A method and system is disclosed for identifying a location of an event in a power distribution network. The method includes receiving voltage and current flowing downstream and upstream of the distribution feeder from at least two distribution-level phasor measurement units (PMUs) installed on a distribution feeder in the power distribution network; calculating changes in forward nodal voltages along the distribution feeder using measurements from at least one PMU of the at least two distribution-level PMUs; calculating changes in backward nodal voltages along the distribution feeder using the measurements from another PMU of the at least two distribution-level PMUs; comparing the calculated changes in the forward nodal voltages to the calculated changes in the backward nodal voltages; and determining the location of the event based on the comparison of the calculated changes of the forward nodal voltages to the calculated changes backward nodal voltages.

20 Claims, 20 Drawing Sheets

(51) Int. Cl.
  *H02J 3/18* (2006.01)
  *G01R 19/25* (2006.01)
(58) Field of Classification Search
  USPC .......................................................... 702/59
  See application file for complete search history.

(56) References Cited

OTHER PUBLICATIONS

"Radial distribution Test Feeders, Distribution System Analysis Sub-committee Rep.", 2017, pp. 1-3.
Arnold et al., "Synchrophasor Data Analytics in Distribution Grids", IEEE Power & Energy Society Innovative Smart Grid Technologies Conference, 2017, pp. 1-5.
Baran et al., "Network Reconfiguralion In Distribution Systems for Loss Reduction and Load Balancing", IEEE Transactions on Power Delivery, vol. 4, No. 2, Apr. 1989, pp. 1401-1407.
Chang et al., "On Tracking the Source Location of Voltage Sags and Utility Shunt Capacitor Switching Transients", IEEE Transactions on Power Delivery, vol. 23, No. 4, Oct. 2008, pp. 2124-2131.
Delavar et al., "A New Scheduling Algorithm for Dynamic Task and Fault Tolerant in Heterogeneous Grid Systems Using Genetic Algorithm", 3rd International Conference on Computer Science and Information Technology, 2010, pp. 408-412.
Eshraghi et al., "Islanding Detection and Over Voltage Mitigation using Controllable Loads", Sustainable Energy, Grids and Networks, vol. 6, Jun. 2016, pp. 125-135.
Eshraghi et al., "Islanding Detection and Transient Over Voltage Mitigation using Wireless Sensor Networks", IEEE Power & Energy Society General Meeting, 2015, pp. 1-5.
Farajollahi et al., "Deployment of Fault Indicator in Distribution Networks: A MIP-Based Approach", IEEE Transactions on Smart Grid, vol. 9, No. 3, May 2018, pp. 2259-2267.
Farajollahi et al., "Locating the Source of Events in Power Distribution Systems Using Micro-PMU Data", IEEE Transactions on Power Systems, vol. 33, No. 6, Nov. 2018, pp. 6343-6354.
Farajollahi et al., "Location Identification of Distribution Network Events Using Synchrophasor Data", Sep. 2017, pp. 1-6.
Farajollahi,"Location Identification of High Impedance Faults Using Synchronized Harmonic Phasors", IEEE Power & Energy Society Innovative Smart Grid Technologies Conference, 2017, pp. 1-5.
Farajollahi et al., "Tracking State Estimation in Distribution Networks Using Distribution-level Synchrophasor Data", IEEE Power & Energy Society General Meeting, 2018, pp. 1-5.
Foruzan et al., "Hybrid System Modeling and Supervisory Control of a Microgrid", North American Power Symposium, 2016, pp. 1-6.
IEEE, "IEEE Guide for Collecting, Categorizing, and Utilizing Information Related to Electric Power Distribution Interruption Events", Aug. 14, 2014, pp. 1-98.
Jamei et al., "Anomaly Detection Using Optimally Placed μPMU Sensors in Distribution Grids", IEEE Transactions on Power Systems, vol. 33, No. 4, Jul. 2018, pp. 3611-3623.
Jamei et al., "Micro Synchrophasor-Based Intrusion Detection in Automated Distribution Systems: Toward Critical Infrastructure Security", IEEE Internet Computing, vol. 20, No. 5, Sep.-Oct. 2016, pp. 18-27.
Krishnathevar et al., "Generalized Impedance-Based Fault Location for Distribution Systems", IEEE Transactions on Power Delivery, vol. 27, No. 1, Jan. 2012, pp. 449-451.
Kumar Suresh, "Electric Circuits and Networks", Pearson Education, Sep. 30, 2008, pp. 1-5.
Liao et al., "Micro-Synchrophasor Data for Diagnosis of Transmission and Distribution Level Events", IEEE/PES Transmission and Distribution Conference and Exposition, 2016, pp. 1-5.
Majidi et al., "A Novel Method for Single and Simultaneous Fault Location in Distribution Networks", IEEE Transactions on Power Systems, vol. 30, No. 6, Nov. 2015, pp. 3368-3376.
Von Meier et al., "Micro-Synchrophasors for Distribution Systems", 2014, pp. 1-5.
Von Meier et al., "Precision Micro-Synchrophasors for Distribution Systems: A Summary of Applications", IEEE Transactions on Smart Grid, vol. 8, No. 6, Nov. 2017, pp. 2926-2936.
Mohsenian-Rad et al., "Autonomous Demand-Side Management Based on Game-Theoretic Energy Consumption Scheduling for the FutureSmart Grid", IEEE Transactions On Smart Grid, vol. 1, No. 3, Dec. 2010, pp. 320-331.
Mohsenian-Rad et al., "Distribution Synchrophasors: Pairing Big Data with Analytics to Create Actionable Information", IEEE Power and Energy Magazine, vol. 16, No. 3, May-Jun. 2018, pp. 26-34.
Pignati et al., "Fault Detection and Faulted Line Identification in Active Distribution Networks Using Synchrophasors-Based Real-Time State Estimation", IEEE Transactions on Power Delivery, vol. 32, No. 1, Feb. 2017, pp. 381-392.
PSL, "Synchrophasors for Distribution, Microgrids: PQube® 3 MicroPMU", 2017, pp. 1-3.
Raoufat et al., "Event Analysis of Pulse-reclosers in Distribution Systems Through Sparse Representation", 19th International Conference on Intelligent System Application to Power Systems, 2017, pp. 1-6.
Ren et al., "An Accurate Synchrophasor Based Fault Location Method for Emerging Distribution Systems", IEEE Transactions on Power Delivery, vol. 29, No. 1, Feb. 2014, pp. 297-298.
Sadeghi-Mobarakeh et al., "Optimal Market Participation of Distributed Load Resources Under Distribution Network Operational Limits and Renewable Generation Uncertainties", IEEE Transactions on Smart Grid, vol. 10, No. 4, Jul. 2019, pp. 3549-3561.
Samuelsson et al., "Monitoring of Power System Events at Transmission and Distribution Level", IEEE Transactions on Power Systems, vol. 21, No. 2, May 2006, pp. 1007-1008.
Seyedi et al., "Distributed Generation Monitoring for Hierarchical Control Applications in Smart Microgrids", IEEE Transactions on Power Systems, vol. 32, No. 3, May 2017, pp. 2305-2314.
Shahsavari et al., "A Data-Driven Analysis of Capacitor Bank Operation at a Distribution Feeder Using Micro-PMU Data", IEEE Power & Energy Society Innovative Smart Grid Technologies Conference, 2017, pp. 1-5.
Shahsavari et al., "A Data-Driven Analysis of Lightning-Initiated Contingencies at a Distribution Grid with a PV Farm Using Micro-PMU Data", North American Power Symposium, 2017, pp. 1-6.
Shahsavari et al., "Autopsy on Active Distribution Networks: A Data-Driven Fault Analysis Using Micro-PMU Data", 2017, pp. 1-6.
Shahsavari et al., "Distribution Grid Reliability versus Regulation Market Efficiency: An Analysis based on Micro-PMU Data", IEEE Transactions on Smart Grid, vol. 8, No. 6, Nov. 2017, pp. 1-10.
Shih et al., "Application of a Robust Algorithm for Dynamic State Estimation of a Power System", IEEE Transactions On Power Systems, vol. 17, No. 1, Feb. 2002, pp. 141-147.
Won et al., "A New Algorithm to Locate Power-Quality Event Source With Improved Realization of Distributed Monitoring Scheme", IEEE Transactions on Power Delivery, vol. 21, No. 3, Jul. 2006, pp. 1641-1647.
Xiao et al., "Harmonic Impedance Measurement using Voltage and Current Increments from Disturbing Loads", Ninth International Conference on Harmonics and Quality of Power., 2000, pp. 220-225.
Zhou et al., "Partial Knowledge Data-Driven Event Detection for Power Distribution Networks", IEEE Transactions on Smart Grid, vol. 9, No. 5, Sep. 2018, pp. 5152-5162.
Alwash et al., "Fault-Location Scheme for Power Distribution System with Distributed Generation", IEEE Transactions on Power Delivery, vol. 30, No. 3, Jun. 2015, 1187-1195.
Bains et al., "Supplementary Impedance-Based Fault-Location Algorithm for Series-Compensated Lines", IEEE Transactions on Power Delivery, vol. 31, No. 1, Feb. 2016, pp. 334-342.

* cited by examiner

TABLE 1
CALCULATED NODAL VOLTAGE VECTORS AND CORRESPONDING MISMATCH VECTOR

| Bus # | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| $\Delta V_7$ | 4.3 | 4.8 | 7.9 | 10.4 | 12.9 | 19.2 | 22.6 | 27.1 | 35.9 | 44.0 | 45.3 | 47.9 | 60.5 | 66.4 | 72.0 | 78.6 | 93.6 | 100.5 |
| $\Delta V_6$ | 42.5 | 42.1 | 40.6 | 39.8 | 39.0 | 37.1 | 36.8 | 36.3 | 35.7 | 35.1 | 35.0 | 34.9 | 34.3 | 34.1 | 33.9 | 33.8 | 33.6 | 33.6 |
| $\Delta V_7 - b$ | 38.2 | 37.3 | 32.7 | 29.4 | 26.1 | 17.9 | 14.2 | 9.2 | 0.0 | 8.9 | 10.3 | 13.0 | 26.2 | 32.3 | 38.1 | 44.8 | 60.0 | 66.9 |

TABLE II
METHOD EFFECTIVENESS AGAINST LINES IMPEDANCE ERROR WITH
DIFFERENT STANDARD DEVIATIONS

| Error of Line Impedance | Correct Location | One Bus Error | > One Bus Error | Maximum Error |
|---|---|---|---|---|
| 10% | 97.42% | 2.58% | 0% | 1 bus |
| 20% | 83.50% | 16.29% | 0.21% | 2 buses |
| 30% | 69.98% | 26.87% | 3.15% | 3 buses |
| 40% | 59.78% | 32.67% | 7.55% | 4 buses |
| 50% | 49.73% | 37.22% | 13.05% | 5 buses |

TABLE III
METHOD EFFECTIVENESS AGAINST PSEUDO-MEASUREMENTS ERROR
WITH DIFFERENT STANDARD DEVIATIONS

| Error of Pseudo-Measurement | Correct Location | One Bus Error | > One Bus Error | Maximum Error |
|---|---|---|---|---|
| 20% | 100% | 0% | 0% | 0 bus |
| 40% | 99.55% | 0.45% | 0% | 1 bus |
| 60% | 96.28% | 3.72% | 0% | 1 bus |
| 80% | 91.1% | 8.89% | 0.01% | 2 buses |
| 100% | 85.85% | 13.97% | 0.18% | 2 buses |

FIG. 8

TABLE IV
METHOD EFFECTIVENESS AGAINST CURRENT MEASUREMENTS ERROR
WITH DIFFERENT STANDARD DEVIATIONS

| Error of Current Phasor | Correct Location | One Bus Error | > One Bus Error | Maximum Error |
|---|---|---|---|---|
| 0.2% | 99.79% | 0.21% | 0% | 1 bus |
| 0.4% | 93.01% | 6.99% | 0% | 1 bus |
| 0.6% | 82.64% | 16.89% | 0.47% | 2 buses |
| 0.8% | 73.22% | 24.05% | 2.73% | 3 buses |
| 1.0% | 57.87% | 32.47% | 9.66% | 4 buses |

FIG. 9

TABLE V

METHOD EFFECTIVENESS AGAINST VOLTAGE MEASUREMENTS ERROR WITH DIFFERENT STANDARD DEVIATIONS

| Error of Voltage Phasor | Correct Location | One Bus Error | > One Bus Error | Maximum Error |
|---|---|---|---|---|
| 0.2% | 97.92% | 2.08% | 0% | 1 bus |
| 0.4% | 83.29% | 16.56% | 0.15% | 2 buses |
| 0.6% | 68.91% | 28.83% | 2.26% | 3 buses |
| 0.8% | 56.72% | 36.10% | 7.18% | 4 buses |
| 1.0% | 40.27% | 39.36% | 20.37% | 5 buses |

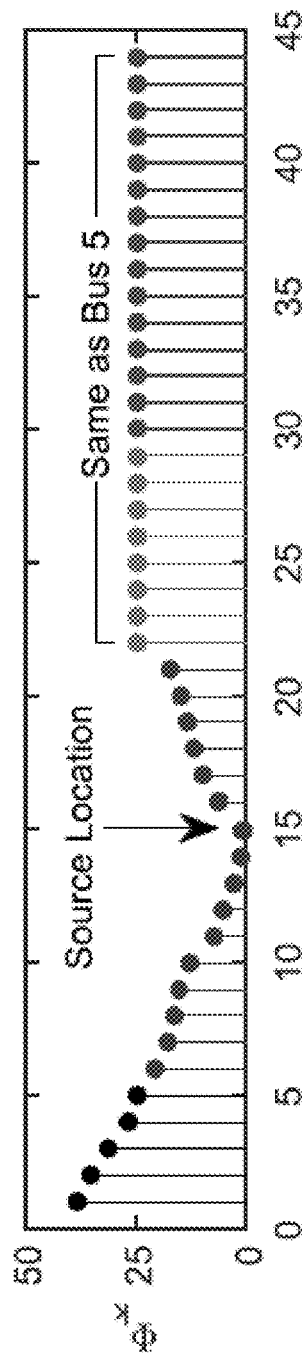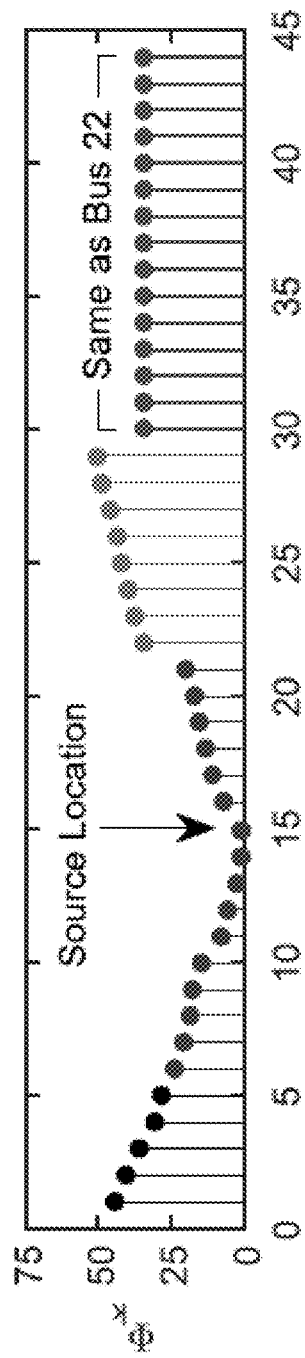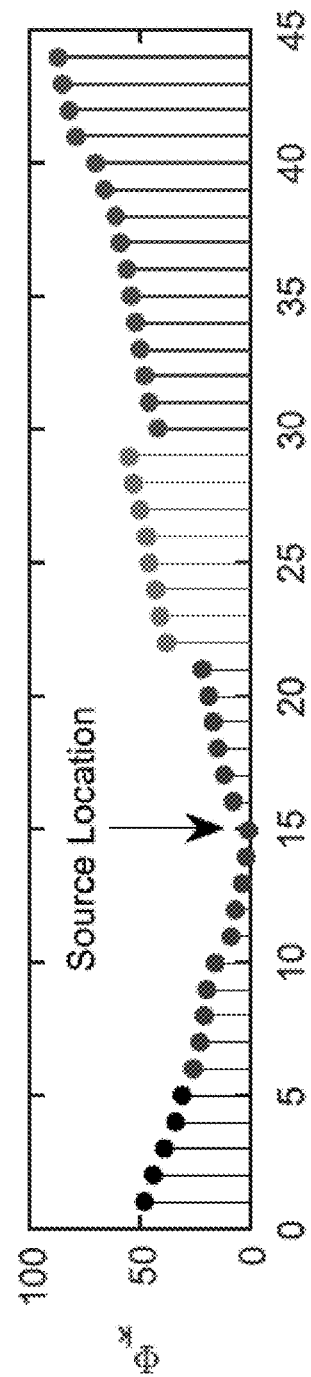
FIG. 14(a)
FIG. 14(b)
FIG. 14(c)

Table VI – Sensitivity Analysis to Error in Line Impedances

| Error in Line Impedance (SD) | Correct Event Bus | Immediate Neighboring Bus | Another Bus | Max Error |
|---|---|---|---|---|
| 5% | 99.9% | 0.1% | 0% | 1 bus |
| 10% | 89.7% | 10.3% | 0.02% | 2 buses |
| 15% | 72.4% | 26.0% | 1.6% | 3 buses |
| 20% | 59.2% | 34.3% | 6.5% | 5 buses |
| 25% | 49.6% | 36.7% | 13.7% | 5 buses |

FIG. 18

Table VII – Sensitivity Analysis to Error in Pseudo-Measurements

| Error in Power Injection (SD) | Correct Event Bus | Immediate Neighboring Bus | Another Bus | Max Error |
|---|---|---|---|---|
| 20% | ~100% | ~0% | 0% | 1 bus |
| 40% | 98.3% | 1.7% | 0% | 1 bus |
| 60% | 92.2% | 7.8% | 0% | 1 bus |
| 80% | 84.6% | 15.4% | 0% | 1 bus |
| 100% | 78.7% | 21.3% | ~0% | 2 buses |

FIG. 19

Table VIII – Performance With Measurement 0.5-Class CT/PT Against Different Load Switching Levels

| Load Switching (p.u.) | Correct Event Bus | Immediate Neighboring Bus | Another Bus | Max Error |
|---|---|---|---|---|
| 5% | 100% | 0% | 0% | 0 bus |
| 2% | 100% | ~ 0% | 0% | 1 bus |
| 1% | 97.3% | 2.6% | 0.1% | 2 buses |
| 0.5% | 95.2% | 4.5% | 0.3% | 2 buses |

FIG. 20

Table IX – Performance with Protection 3-Class CT/PT Against Different Fault Levels

| Fault Impedance | Correct Event Bus | Immediate Neighboring Bus | Another Bus | Max Error |
|---|---|---|---|---|
| 5 $\Omega$ | 100% | 0% | 0% | 0 bus |
| 10 $\Omega$ | 100% | ~0% | 0% | 1 bus |
| 50 $\Omega$ | 98.3% | 1.7% | 0% | 1 bus |
| 100 $\Omega$ | 96.5% | 3.3% | 0.2% | 2 buses |

FIG. 21

Table X

Performance for Different Event Strengths and Different Measurement Errors

| Event (% MVA base) | ΔS (MVA) | ΔV (Volt) | Error in Measurement (Magnitude/Angle) | | | |
|---|---|---|---|---|---|---|
| | | | (0.01%, 0.003°) | (0.025%, 0.006°) | (0.05%, 0.01°) | (0.1%, 0.02°) |
| 0.5% | 20 | 6 | 95.2 | 93.6 | 80.8 | 51.2 |
| 1% | 40 | 12 | 97.3 | 95.3 | 93.7 | 81.2 |
| 2% | 80 | 24 | 100 | 96.2 | 95 | 93.7 |
| 5% | 200 | 62 | 100 | 100 | 97.6 | 94.9 |
| 10% | 400 | 126 | 100 | 100 | 100 | 97.8 |

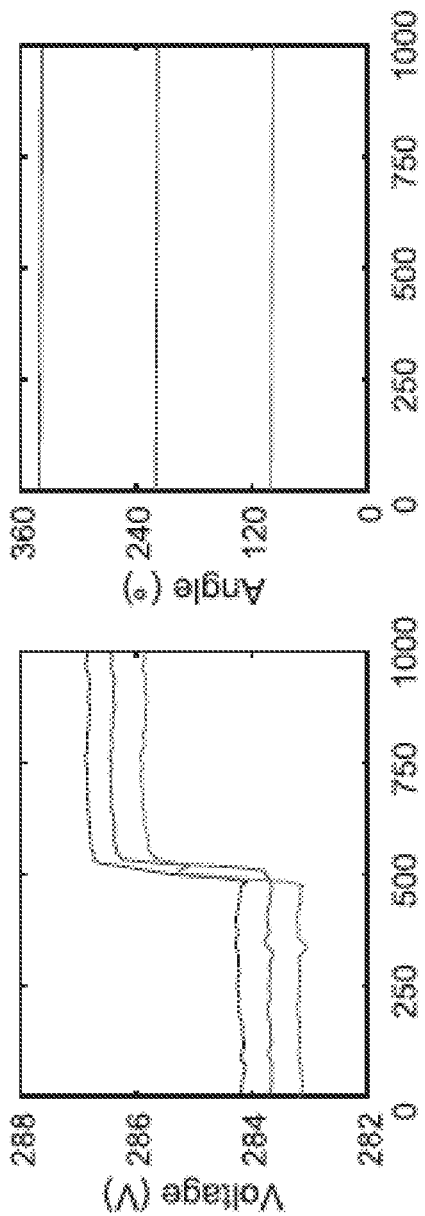
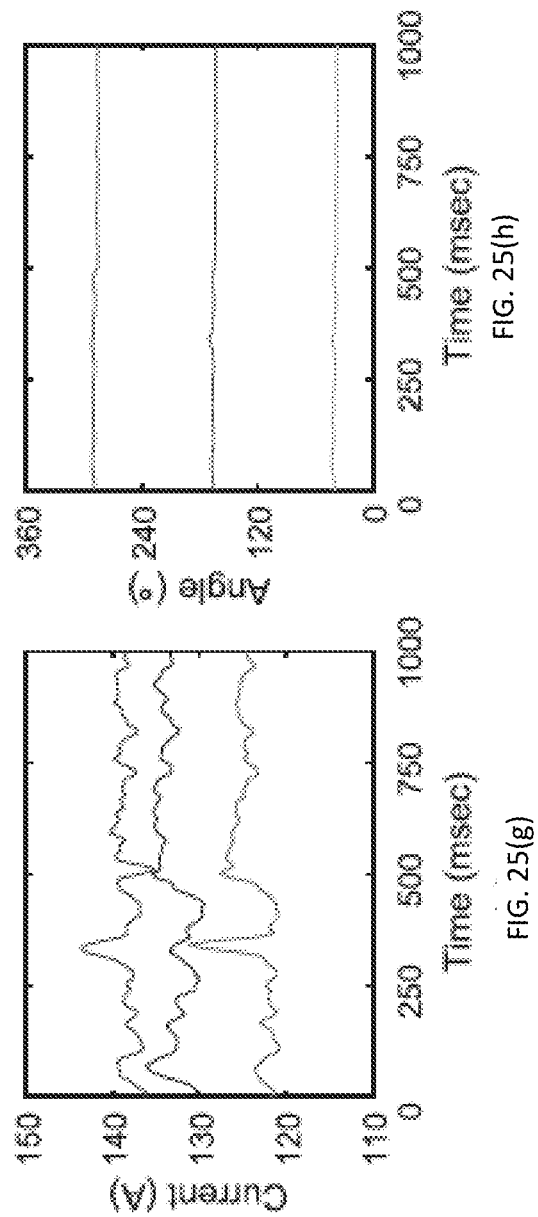
FIG. 25(e)
FIG. 25(f)
FIG. 25(g)
FIG. 25(h)

METHOD AND SYSTEM FOR LOCATING THE SOURCE OF EVENTS IN POWER DISTRIBUTION SYSTEMS USING DISTRIBUTION-LEVEL PMU DATA

CROSS-REFERENCE TO RELATED APPLICATION

This application claims priority to U.S. Provisional Application No. 62/682,709, filed Jun. 8, 2018, the entire content of which is incorporated herein by reference.

FIELD OF THE INVENTION

The disclosure relates to a method and system for locating the source of events in power distribution systems using distribution-level phasor measurement units (a.k.a. micro-PMU) data.

BACKGROUND

The events at distribution grid are often categorized into two main groups, power quality (PQ) events, such as voltage sag and swell due to capacitor bank or load switching, and emergency events, such as interruption in service due to fuse blowing or relay tripping. Historically, the detection and location identification of emergency events, such as permanent fault events, have been of greater interest to electric utilities than the PQ events, because of the need to accelerate the isolation and service restoration processes in case of emergency events. However, in recent years, electric utilities have increasingly become interested in location identification of not only emergency events but also PQ events due to proliferation of customer devices that are sensitive to the power quality.

The existing methods to identify event locations at distribution grid, whether of PQ type or emergency type, can be categorized into two main groups: impedance-based and wide-area monitoring methods. The former class of methods work based on calculating the line impedance between the fault location and the sensor location. Such methods work well only for permanent faults. The main problem with the impedance calculation methods is that the results are rarely precise, i.e., they identify multiple possible locations for the event. These methods are also highly prone to errors related to measurements and the fault impedance.

As for the wide-area monitoring methods, they work based on the fact that voltages and currents along the feeders fluctuate due to either PQ events or emergency events. In this regard, these methods use the pre-event and post-event states of the grid to identify the exact location of the fault. Voltage and current fluctuations along the distribution feeder greatly depend on the type of the event as well as the location of the event. For example, pre-event and post-event grid states have been used to track the location of the source of disturbance for voltage sags and shunt capacitor switching in a power distribution system. One method was based on analyzing the transient behavior of current and voltage waveforms captured by power quality sensors.

Due to the recent development of the distribution-level phasor measurement units, a.k.a, micro-PMUs, wide-area monitoring methods can now be implemented in practice. The previously proposed state estimation based methods are concerned with identifying the location of permanent faults, while assuming that all nodes are equipped with micro-PMUs, i.e., the grid is beyond fully observable. Subsequent to a fault, several parallel state estimation tasks are conducted based on different hypothesis on fault on different lines. The location of the fault is then deemed identified at the line where the related state estimation residual has the minimum value.

Another example to conduct event location identification based on micro-PMU data was on identifying PQ events related to the operation of a capacitor bank. Voltage measurement-based approaches to track the network modifications and to locate islanding events, and algorithms to identify frequent dynamic events have also been proposed.

SUMMARY

In accordance with an exemplary embodiment, a method and system is disclosed, which can identify the location of events in power distribution systems. For example, an event can be defined broadly here to include a change in state of a switch, a change in voltage, in form of, for example, a sag or swell. In accordance with an exemplary embodiment, the method is based on the compensation theorem in circuit theory to generate an equivalent circuit according to the pre-event and post-event feeder states. To such aim, the post-event voltage deviations from pre-event values are assumed to be measured by distribution-level phasor measurement units, a.k.a, micro-PMUs. The fact that it is neither economic nor necessary to measure every node's voltage deviation along the feeder to find the source and location of the event. In fact, data from as few as only two micro-PMUs, that are installed at the beginning and at the end of the feeder, can be used to identify the location of an event. The rest of the information collected from the feeder is in form of pseudo-measurements. Despite the natural inaccuracy in pseudo-measurements, the proposed hybrid method is robust against the pseudo-measurements error.

A method is disclosed for identifying a location of an event in a power distribution network, the method comprising: receiving voltage and current flowing downstream and upstream of the distribution feeder from at least two distribution-level phasor measurement units (PMUs) installed on a distribution feeder in the power distribution network; calculating changes in forward nodal voltages along the distribution feeder using measurements from at least one PMU of the at least two distribution-level PMUs; calculating changes in backward nodal voltages along the distribution feeder using the measurements from another PMU of the at least two distribution-level PMUs; comparing the calculated changes in the forward nodal voltages to the calculated changes in the backward nodal voltages; and determining the location of the event based on the comparison of the calculated changes of the forward nodal voltages to the calculated changes backward nodal voltages.

A non-transitory computer readable medium (CRM) storing computer program code executed by a computer processor for identifying an event in a power distribution network, comprising: receiving voltage and current flowing downstream and upstream of the distribution feeder from at least two distribution-level phasor measurement units (PMUs) installed on a distribution feeder in the power distribution network; calculating changes in forward nodal voltages along the distribution feeder using measurements from at least one PMU of the at least two distribution-level PMUs; calculating changes in backward nodal voltages along the distribution feeder using the measurements from another PMU of the at least two distribution-level PMUs; comparing the calculated changes in the forward nodal voltages to the calculated changes in the backward nodal voltages; and determining the location of the event based on the comparison of the calculated changes of the forward nodal voltages to the calculated changes backward nodal voltages.

A system is disclosed for identifying a location of an event in a power distribution network, the system comprising: at least two distribution-level phasor measurement units (PMUs) installed in the power distribution network on a distribution feeder; and a processor configured to: receive voltage and current flowing downstream and upstream of the distribution feeder from at least two distribution-level phasor measurement units (PMUs); calculate changes in forward nodal voltages along the distribution feeder using measurements from at least one PMU of the at least two distribution-level PMUs; calculate changes in backward nodal voltages along the distribution feeder using the measurements from another PMU of the at least two distribution-level PMUs; compare the calculated changes in the forward nodal voltages to the calculated changes in the backward nodal voltages; and determine the location of the event based on the comparison of the calculated changes of the forward nodal voltages to the calculated changes backward nodal voltages.

BRIEF DESCRIPTION OF THE DRAWINGS

FIG. 8 is Table III, which illustrates Method Effectiveness against Pseudo-Measurements Error with Different Standard Deviations.

FIG. 9 is Table IV, which illustrates Method Effectiveness against Current Measurements Error with Different Standard Deviations.

FIGS. 14(a)-14(c) illustrate results for Case I based on the IEEE 123-bus test system with data from (a) two micro-PMUs, (b) three micro-PMUSs, and (c) four micro-PMUs.

FIG. 18 is Table VI, which illustrates sensitivity analysis to error in lines impedances.

FIG. 19 is Table VII, which illustrates sensitivity analysis to error in pseudo-measurements.

FIG. 20 is Table VIII, which illustrates performance with measurement 0.5-Class CP/PT against different load switching levels.

FIG. 21 is Table IX, which illustrates performance with protection 3-class CP/PT against different fault levels.

FIGS. 25(a)-25(h) illustrate a real-life capacitor bank switching on event, wherein (a)-(d) are measurements from micro-PMU 1 and (e)-(h) are measurements from micro-PMU 2.

DETAILED DESCRIPTION

In accordance with an exemplary embodiment, a system and method of using voltage and current synchrophasor data is developed to identify the location of PQ events as well as emergency events.

In accordance with an exemplary embodiment, the method is based on the analysis of the equivalent-circuit for feeder, obtained by applying compensation theorem from circuit theory, according to the pre-event and post-event feeder states. The approach is highly practical because it requires using only two phasor measurement devices to identify the location of an event. The two micro-PMUs are proposed to be installed at the beginning and at the end of the feeder. In accordance with an exemplary embodiment, the effectiveness of the developed method was examined on the IEEE 33 bus test system in PSCAD, followed by sensitivity analysis and discussions on the results.

Event Location Identification Method

This section describes the method for identifying the location of an event in a distribution feeder. First, a basic circuit theorem is introduced. The method, then, is developed based on the theorem. Finally, the proposed algorithm for event location identification is presented.

Compensation Theorem

An event in a circuit can change all or a subset of nodal voltages and branch currents along the circuit. According to the compensation theorem, once an element changes in a circuit, the amount of changes in the nodal voltages and branch currents can be obtained through an equivalent circuit, in which the changed element is replaced with a current source that injects current at a level equal to the amount of change in the current going through the element; and all sources are replaced with their internal impedances. The importance of the compensation theorem is in the fact that the analysis of an event through the analysis of such equivalent circuit is easier than through the analysis of the original circuit.

Figure 1A:
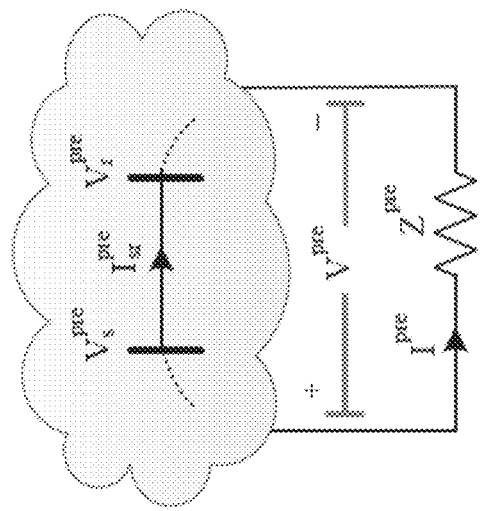
FIGS. 1(a)-1(c) is an illustration of compensation theorem, wherein 1(a) is a pre-event network, 1(b) is a post-event network, and 1(c) is an equivalent circuit based on compensation theorem.

As an illustrative example, consider an element with impedance $Z^{pre}$, as shown in FIG. 1(a). Suppose $Z^{post}$ denotes the element impedance after a change occurs in the element, shown in FIG. 1(b). Let $I^{pre}$ and $I^{post}$ denote the currents that are drawn by the element before and after the change, respectively. According to the compensation theorem, the equivalent circuit of this network can be obtained by replacing the changed impedance element with current source $$\Delta I = I^{post} - I^{pre}, \quad (1)$$

and all sources with their internal impedances. The equivalent network, shown in FIG. 1(c), can be used to analyze the changes of the nodal voltages and branch currents, i.e., $$\Delta V_s = V_s^{post} - V_s^{pre} \quad (2)$$

and $$\Delta I_{sr} = I_{sr}^{post} - I_{sr}^{pre}. \quad (3)$$

In accordance with an exemplary embodiment, the proposed application of the compensation theorem in distribution systems is to identify the location of an event, of PQ or emergency type.

Methodology

Figure 2:
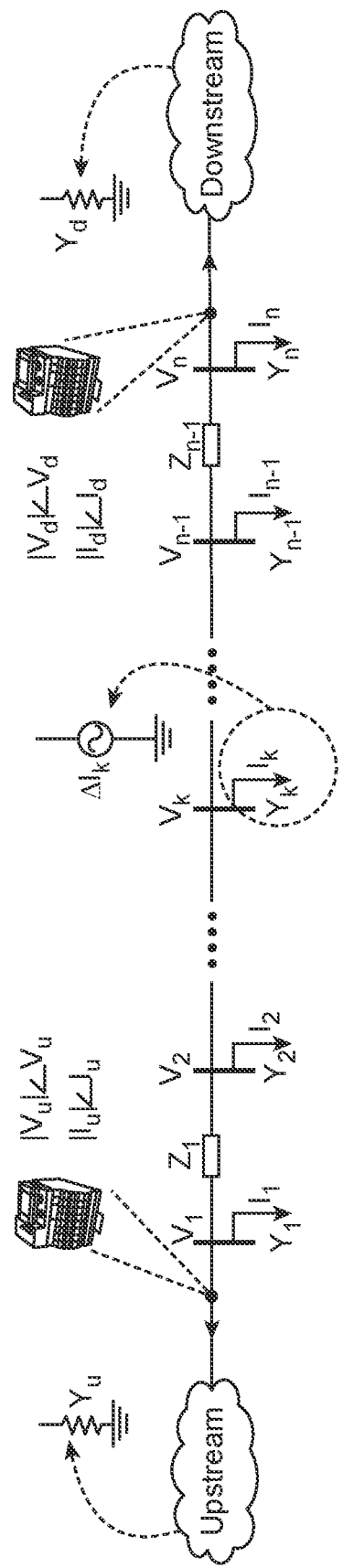
FIG. 2 is an illustration of a distribution feeder based on compensation theorem equivalent circuit and wherein the measurements are done by two micro-PMUs.

Consider a distribution feeder, such as the one shown in FIG. 2. In accordance with an exemplary embodiment, for example, suppose two micro-PMUs are installed on this feeder, one at the substation and one at the end of the feeder. The micro-PMUs record the voltage and current flowing at the downstream and upstream of the feeder. There are n buses across the feeder, for example, between the two micro-PMUs. All loads are assumed to have constant impedances. In case of a lateral, the lateral is replaced with its equivalent admittance.

Suppose the feeder experiences an event, whether a PQ event or an emergency event, at bus k, where $k \in \{1, \ldots n\}$. Based on the compensation theorem, a current source with current $\Delta I_k$ can be replaced at bus k in order to create an equivalent circuit. The nodal voltages and branch currents in the presence of current source $\Delta I_k$ are equal to the changes in nodal voltages and branch currents, obtained from subtracting pre-event and post-event states. Therefore, we conclude that the voltage and current at the beginning and at the end of the equivalent feeder are essentially equal to the changes in voltages and currents that are recorded by the micro-PMUs.

1) Forward Nodal Voltages Calculation:

The changes in nodal voltages along the feeder can be calculated by using the measurements from the micro-PMU at the beginning of the feeder, together with pseudo-measurements, as follows:

$$\Delta V_1^f = \Delta V_u \quad (4)$$
$$\Delta V_2^f = \Delta V_1^f + (\Delta I_u + \Delta I_1^f) Z_1$$
$$\vdots$$
$$\Delta V_n^f = \Delta V_{n-1}^f + (\Delta I_u + \Delta I_1^f + \cdots + \Delta I_{n-1}^f) Z_{n-1}$$

where $\Delta V_i^f$ denotes the forward calculated nodal voltage of bus i by starting from the beginning of the feeder, and $\Delta I_i^f$ denotes the current injection at bus i. Note that, $\Delta I_i^f$ is equal to $Y_i \Delta V_i^f$, where $Y_i$ indicates the equivalent admittance of the lateral i, and can be obtained based on the pseudo-measurements and system voltage. Notations $\Delta V_u$ and $\Delta I_u$ indicate the difference between the pre-event and post-event voltage and current, captured by the micro-PMU installed at the beginning of the feeder. Given the measurement precision of micro-PMUs and since bus 1 is where the micro-PMU at the beginning of the feeder is installed, we set $\Delta V_1^f$ equal to the change in voltage recorded by the micro-PMU at the beginning of the feeder. In addition, considering the voltage drop made by the current flowing through the line with impedance $Z_1$ leads to calculating $\Delta V_2^f$. Similarly, all the nodal voltages across the feeder can be obtained from the previous buses' voltage and laterals' current hierarchically.

2) Backward Nodal Voltages Calculation:

In a similar manner, the nodal voltages along the feeder can be calculated by using the measurements of the micro-PMU at the end of the feeder, together with pseudo-measurements, as follows:

$$\Delta V_n^b = \Delta V_d \quad (5)$$
$$\Delta V_{n-1}^b = \Delta V_n^b + (\Delta I_d + \Delta I_n^b) Z_{n-1}$$
$$\vdots$$
$$\Delta V_1^b = \Delta V_2^b + (\Delta I_d + \Delta I_n^b + \cdots + \Delta I_2^b) Z_1$$

where $\Delta_i^b$ represents the backward calculated nodal voltage of bus i by starting from the end of the feeder. Here, $\Delta I_i^b$ denotes the current injection at bus i, which is equal to $Y_i \Delta V_i^b$. Notations $\Delta V_d$ and $\Delta I_d$ indicate the difference between pre-event and post-event voltage and current, captured by the micro-PMU installed at the end of the feeder. Since a micro-PMU is at bus n, we set $\Delta V_n^b$ equal to the change in the voltage recorded by the micro-PMU at the end of the feeder.

3) Voltage Comparison:

In the two sets of equations that were obtained in (4) and (5), it is assumed that for all the laterals the current can be obtained from the production of nodal voltage and bus admittance. The calculation based on such product is valid for all the buses, except for bus k in which the event occurs. At this bus, current source $\Delta I_k$ injects current into the equivalent feeder and the production of voltage and lateral admittance is no longer correct for this bus current. Therefore, the downstream voltages of bus k calculated in equation (4), i.e., $\{\Delta V_{k+1}^f, \ldots, \Delta V_n^f\}$, and the upstream voltages of bus k calculated in equation (5), i.e., $\{\Delta V_1^b, \ldots, V_{K-1}^b\}$, are not correct, and they cannot be considered correct nodal voltages. In other words, the following distinctions across the calculated voltages can be made:

$$\{\underbrace{\Delta V_1^f, \cdots, \Delta V_k^f}_{correct}, \underbrace{\Delta V_{k+1}^f, \cdots, \Delta V_n^f}_{incorrect}\} \quad (6)$$

$$\{\underbrace{\Delta V_1^b, \cdots, \Delta V_{k-1}^b}_{incorrect}, \underbrace{\Delta V_k^b, \cdots, \Delta V_n^b}_{correct}\}$$

The fundamental observation in (6) is that the calculated voltage at bus k in both backward and forward nodal voltage calculations is a correct value. In other words, $\Delta V_k^f$ and $\Delta V_k^b$ are essentially equal, because if they are not equal then at least one of them must be incorrect, which is a contradiction.

Next, the discrepancy of the nodal voltages obtained from both calculations across each bus is defined as:

$$\Delta V_i^{f-b} = |\Delta V_i^f - \Delta V_i^b|, \forall i \quad (7)$$

where $V_i^{f-b}$ is designated as the difference between $\Delta V_i^f$ and $\Delta V_i^b$, defined in (4) and (5), respectively. According to (6), among all buses, the voltage of bus k in the two calculated nodal voltages sets are most similar; therefore, it is expected that $\Delta V_k^{f-b}$ has the minimum value among all buses:

$$k^* = \arg\min_k \Delta V_k^{f-b}. \quad (8)$$

4) Validity of the Method:

The method is based on the implicit assumption that the event occurs in the area between the two micro-PMUs. Therefore, before using the method, one should first determine whether the event has indeed occurred in such area. This can be done by checking the equivalent upstream and downstream admittances calculated by the two micro-PMUs. The equivalent admittances seen by the micro-PMUs can be calculated as:

$$Y_u = \frac{\Delta I_u}{\Delta V_u} \quad (9)$$

and $$Y_d = \frac{\Delta I_d}{\Delta V_d}, \quad (10)$$

where $Y_u$ and $Y_d$ indicate the equivalent admittances of the upstream and downstream of the feeder in the equivalent circuit, respectively. If the real parts of $Y_u$ and $Y_d$ are both positive, then the event is initiated from a point within the area restricted by micro-PMUs. Otherwise, the event occurred outside this area, for example, somewhere at the transmission level or at the downstream feeder.

Algorithm

Once the event has indeed occurred in the area between the two micro-PMUs is confirmed, the next step is to calculate the nodal voltages along the feeder through forward calculation by starting from the beginning of the feeder, as well as backward calculation by starting from the end of the feeder. The exact location of the event is then determined to be at the bus where the two calculated nodal voltages by the forward and backward methods have the most least discrepancy among all buses. The method is summarized in Algorithm 1.

---

Algorithm 1 Event Location Identification

Input: Micro-PMUs measurements, pseudo-measurements.
Output: The location of an event.
1: Obtain $Y_u$ and $Y_d$, as in (9) and (10), respectively.
2: if $R\{Y_u\} < 0$ or $R\{Y_d\} < 0$. then
3:    The change is between the two micro-PMUs.
4: else
5:    Obtain vector $\Delta V^f$ using (4).
6:    Obtain vector $\Delta V^b$ using (5).
7:    Obtain vector $\Delta V^{f-b}$ using (7).
8:    Obtain the event location k* using (8).
9:    return k*
10: end if

---

Case Studies

Figures 3, 4:
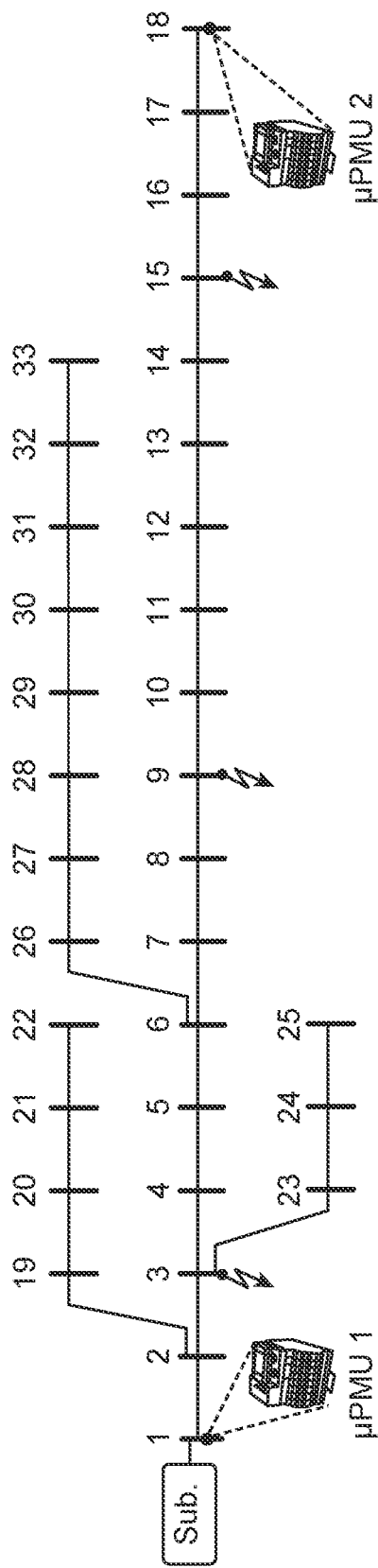
FIG. 3 is an illustration of an under-study feeder that is simulated in PSCAD, and wherein three different scenarios are simulated at buses 3, 9, and 15.
FIG. 4 is Table I, which illustrates Calculated Nodal Voltage Vectors and Corresponding Mismatch Vector in accordance with an exemplary embodiment.

This section demonstrates the effectiveness of the proposed event location identification method by applying it to the IEEE 33 bus test system. The single line diagram of the feeder is shown in FIG. 3, and the relevant technical data can be found in M. E. Baran and F. F. Wu, "Network reconfiguration in distribution systems for loss reduction and load balancing," IEEE Transactions on Power Delivery, vol. 4, no. 2, pp. 1401-1407, April 1989. As set forth below, following a brief description over the implementation of the developed method on this test system, simulations results for different types of events and various under-contingency sensitivity analyses to examine the effect of different parameters on the method robustness are presented.

Implementation of the Method on IEEE 33 Bus

The IEEE 33 bus test feeder was simulated in PSCAD, and the voltages and currents of bus 1 and bus 18 are read as pre-event measurements at the beginning and at the end of the feeder, which are deemed to be provided by micro-PMU 1 and micro-PMU 2. By applying an event at a defined bus, the feeder is again simulated and similar to the original feeder, the post-event measurements are obtained. The discrepancy of pre-event and post-event measurements is recorded to be used by the method, according to the equivalent-circuit that is formed based on the compensation theorem. This equivalent-circuit consists of a main feeder with 18 buses, in which the laterals are deemed equivalent admittances connected to the main feeder buses. The task here is to identify the location of an event on the main feeder by using Algorithm 1.

Case I: PQ Event

The PQ event in this case study was in the form of a typical load switching action. A 60 kVA load, with power factor 0.95, is switched on at a certain bus on the main feeder. Note that the total loading of the feeder is 4.5 MV A. The switching of such a small load does not cause major disturbance, since the connected load is only 1.33% of total loading.

Table I (FIG. 4) shows the results for the case where the PQ event happens at bus 9. It can be seen that, $\Delta V^{f-b}$ has its minimum value, 0.2 V, at bus 9, i.e., the forward and backward voltage calculations have their smallest mismatch at bus 9. Accordingly, Algorithm 1 identifies bus 9 as the location of the event, which is correct. The second smallest voltage mismatch occurs at bus 10 with value 8.9 V, which is considerably greater than the mismatch at bus 9. Such large difference between the first and the second largest voltage mismatches provides a reliable margin to accurately distinguish the location of the event.

Figure 5:
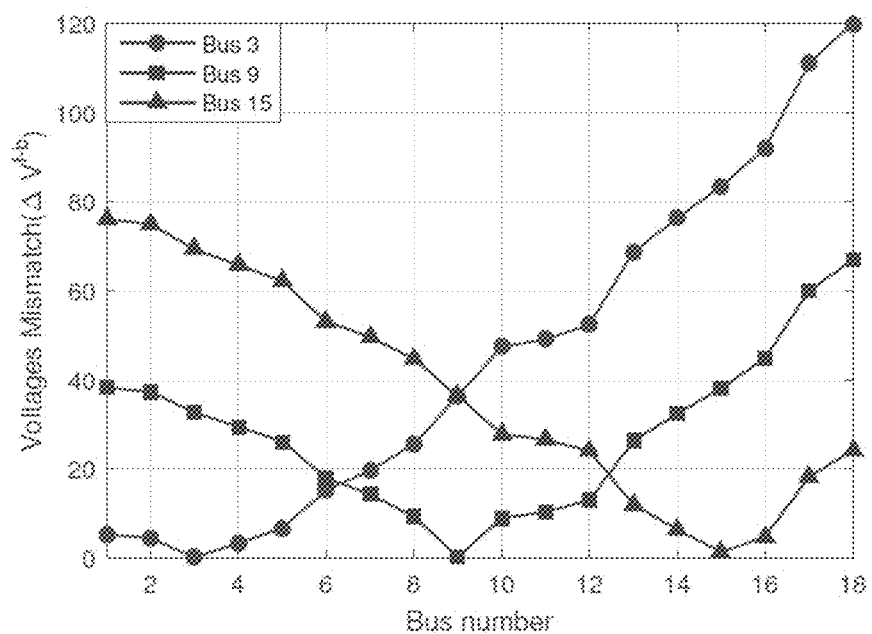
FIG. 5 is an illustration of results associated with three different locations of PQ event.

Next, the same type of PQ event is simulated to occur at two other locations, for example, buses 3 and 15. The results are shown in FIG. 5, and the curves are related to mismatch vectors. According to the curve associated with the event at bus 3, the mismatch vector has the minimum value at bus 3. It means that the two nodal voltage vectors at bus 3 have the most similarity, which results in Algorithm 1 to correctly identify bus 3 as the location of the event. Similarly, for the curve associated with the event at buses 9 and 15, the mismatch vectors carry their minimum at the bus where the event occurs. As can be seen, as one moves away from the bus undergoing the event, the values of mismatch increase. Thus, Algorithm 1 accurately identified the location of the PQ event in all three cases.

Case II: Emergency Event

In this disclosure, an emergency event is defined as a fault occurrence which significantly changes the value of currents and voltages along the feeder. Here, a fault with the resistance of $1\Omega$ is considered as an emergency event. The value of the fault current varies from roughly 800 A to 3000 A with respect to the location of fault along the feeder. This high level of current magnitude makes sure that the fault current would be enough to be qualified as an emergency event.

Figures 6, 7:
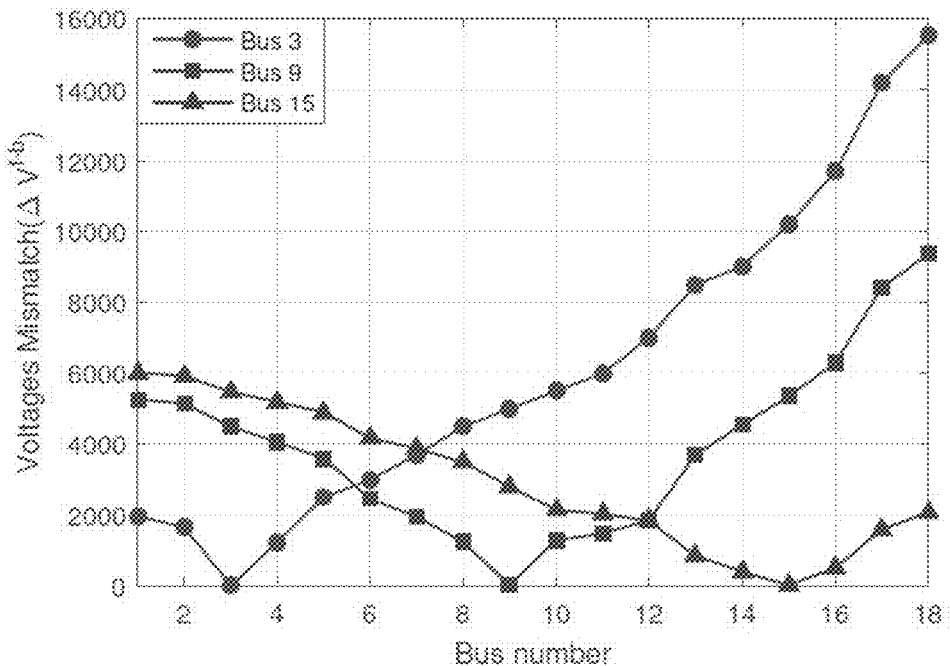
FIG. 6 is an illustration of results associated with three different locations of emergency event.
FIG. 7 is Table II, which illustrates Method Effectiveness against Lines Impedance Error with Different Standard Deviations.

Again, three different locations are examined as the location of the event, i.e., including bus 3, 9, and 15. FIG. 6 depicts the curves associated with the mismatch vectors. As shown, for each event, the curve has its minimum value at the bus in which the fault occurs. It is also obvious that by going far from the location of the fault, the values of mismatch vectors increase.

In accordance with an exemplary embodiment, it was interesting to compare the amount of voltage mismatch $\Delta V^{f \cdot b}$ in FIGS. 5 and 6. As shown, the voltage mismatch is much larger for the emergency event than for the PQ event, and as such, there is a much greater margin of accuracy in identifying the correct location for emergency events; therefore, it is very unlikely for the location of an emergency event to be identified incorrectly.

Under-Contingency Sensitivity Analysis

In practice, the utility's knowledge about system parameters is not perfect. The range of uncertainty varies for different types of parameters; nevertheless, for a defined level of parameters accuracy, the robustness of the method against the parameter variations should be determined. In order to do so, this section conducts some under-contingency sensitivity analyses to investigate the impact of different parameters uncertainty on the method's effectiveness.

Recall that the method makes use of four principal parameters: impedances of the distribution lines, pseudo-measurements, current synchrophasor measurements, and voltage synchrophasor measurements. For each system parameter, Mont Carlo approach is used to generate different scenarios based on the errors in the system parameter.

Table II (FIG. 7) shows the results obtained from the lines impedance variations. As shown, for lines impedance error with 10% standard deviation, nearly 95.5% of the event location identifications are done correctly, and just in 2.5% of the results, the location of events is wrongly identified, in which the neighboring buses are wrongly identified as the bus where the event occurs. Also, with this range of error, the location of the event is identified to be no more than one bus away from the true location of the event, implying that in the worst case, the event location might be identified at the neighboring buses.

By increasing the error in lines impedance, the results demonstrate a satisfying estimation of the event location identification. For instance, for lines impedance error with 50% standard deviation, roughly 50% of event locations are found correctly, and just 13% of the events location are wrongly identified at the buses beyond the neighboring buses. This indicates that even with a large range of errors in lines impedance, a great portion of wrong identifications are related to identifying the neighboring buses as the location of the event.

Table III (FIG. 8) provides the results corresponding to pseudo-measurements. In networks that are not fully observable, the exact values of power injections at buses are not defined. In this regard, the pseudo-measurements are defined as power injections at the buses which are mostly obtained via historical data and the capacity of distribution transformers installed at the beginning of laterals. Therefore, pseudo-measurements are prone to a large range of errors. As the results shown, errors with 20% standard deviation does not have any effect on the accuracy of the method, and for the errors with standard deviations up to 60%, the worst wrong identification is related to neighboring buses. Accordingly, the method is highly robust against the pseudo-measurements error.

Table IV (FIG. 9) and Table V (FIG. 10) represent the results related to the errors in the current and voltage measurements, respectively. In this study, it is assumed that the micro-PMUs serve as the only measurement devices. These devices are highly accurate and the range of their error is even less than the commercial PMUs already used in transmission level. Here, the standard deviation of errors considered for micro-PMUs are related to total vector error which includes both the magnitude and angle errors. In accordance with an exemplary embodiment, it can be seen that the error in voltage phasors has greater effect on the method's accuracy than the error in current phasors. This fact is so desired, because usually the current phasors are perturbed by the noises which are difficult to get filtered, while the voltage measurements do not contain such level of noise, so they can be used with more confidence.

As set forth, a system and method are disclosed, based on an innovative application of the compensation theorem in circuit theory combined with making effective use of data from micro-PMUs, to identify the location of events in distribution systems, whether of PQ type events or emergency type events. Based on the simulation results in PSCAD, if the network is correctly modeled and the pseudo-measurements are precisely obtained, the method accurately estimates the exact location of the event. However, in practice, the network modeling and pseudo-measurements are prone to a level of inaccuracy. For a reasonable range of error in lines impedance, the method confidently estimates the location of an event, or in the worst case scenario provides a satisfying estimation of neighboring buses of the bus that undergoes the event. Importantly, the method is highly robust against error in pseudo-measurements, which is highly desired for networks with few number of micro-PMU installations. In addition, it was demonstrated that for a defined range of error in micro-PMUs measurement, the method results in a reliable estimation of the event location.

As described above, distribution-Level phasor measurement units (PMUs), a.k.a., micro-PMUs (μPMUs), have recently been introduced as new sensor technologies to enhance real-time monitoring in power distribution systems. Micro-PMUs provide GPS-synchronized measurements of three-phase voltage and current phasors at a high resolution, for example, 120 readings per second. Several emerging applications of micro-PMUs, including model validation, distribution system state estimation, topology detection, phase identification, distributed generation, and transient analysis.

Figures 10, 11:
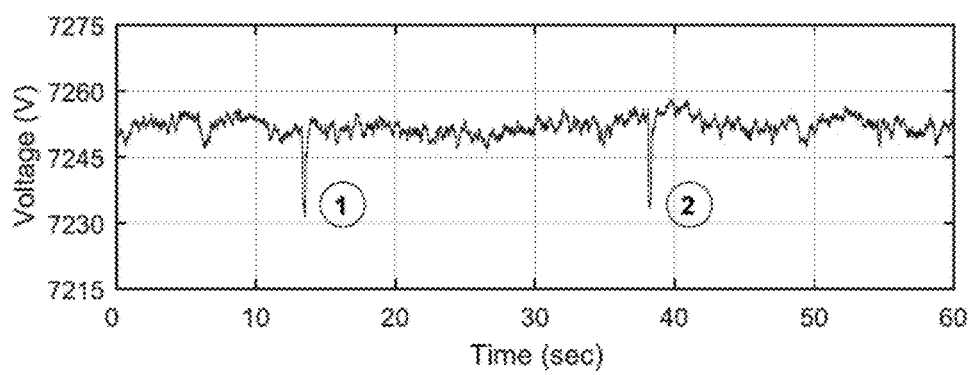
FIG. 10 is Table V, which illustrates Method Effectiveness against Voltage Measurements Error with Different Standard Deviations.
FIG. 11 illustrates voltage phasor magnitude that is measured in a distribution substation in accordance with an exemplary embodiment.

In accordance with an exemplary embodiment, for example, consider one minute of voltage phasor measurements in FIG. 11 from a micro-PMU at a 12.47 kV distribution substation in Riverside, Calif. As expected, there are fluctuations in voltage magnitude, including two voltage sag events. Each event has a root cause at either transmission network or distribution network. Common root causes of distribution level events include load switching, capacitor bank switching, connection or disconnection of distributed energy resources (DERs), inverter malfunction, a minor fault, etc. Accordingly, in this disclosure, an answer to the following question is sought: for those events with root causes in distribution network, what is the location of such root cause, for example, at what exact distribution bus does the load switching, capacitor bank switching, DER connection/disconnection, or device malfunction occur?

Answering the above question can be important in achieving situational awareness in power distribution systems, so as to keep track of how various grid equipment, assets, DERs, and loads operate or misoperate. The applications are diverse, ranging from identifying incipient failures or cyber-attacks, to recruiting demand side resources to construct a self-organizing power distribution system. Here, an event can be defined rather broadly to include any major change in a component across the distribution feeder. This of course includes the two traditional classes of electric distribution system events, namely power quality (PQ) events, such as dropping below or exceeding above acceptable nodal voltage limits, as well as reliability events, such as interrupting service due to faults that cause fuse blowing or relay tripping. However, since the goal in this disclosure is to enhance situational awareness in power distribution systems, one can also be interested in PQ events that do not necessarily violate PQ requirements or undermine reliability, but they do indicate how different components across the distribution feeder operate.

Considering the related literature on micro-PMUs, so far, most studies have focused on detecting the presence of and/or scrutinizing the characteristics of certain events, whose source locations are assumed to be known. The events that have been previously studied include capacitor bank switching, transformer tap changing, inverter misoperation, and load switching. In this disclose, once the source of an event is located by using the method in this disclosure, one can use the techniques in to further the event and its characteristics.

There are also occasional studies that address event source location identification using micro-PMUs, and high-impedance fault location. As for the general literature on event source location identification, most prior studies are not related to micro-PMUs. Several methods in this field can be classified as impedance-based methods, which work based on calculating the impedance between the event location and the sensor location. These methods are widely used to locate permanent faults. A fundamental assumption in impedance-based methods is that the change in impedance is purely resistive. However, this assumption is not true in events such as DER switching, capacitor bank switching, and load switching. Therefore, impedance-based method cannot be directly applied for these types of events.

Another class of methods work based on wide-area monitoring. They collect and examine data from several sensors across the distribution system. Most existing wide-area monitoring methods are concerned only with fault events. They often work by first hypothetically placing the event at different locations, then calculating the states of the distribution system corresponding to each hypothesis, and then comparing the state calculation results with measurements to test each hypothesis. This can be computationally complex.

Wide-area methods are used also to identify the source location for major PQ events, to obtain the operation status for DERs, and to detect islanding. They often use state or parameter estimation or other statistical techniques. Therefore, they may need several sensors in order to assure accuracy, as opposed to as few as only two sensors in this disclosure. Also, it is common for this group of methods to use waveform sensors, as opposed to micro-PMUs, to compare the voltage and/or current waveforms at different locations.

In accordance with an exemplary embodiment, this disclosure proposes a method to locate the source of events in power distribution systems, where events are defined, for example, in a relatively broad sense.

In accordance with an exemplary embodiment, a method is developed based on the compensation theorem in circuit theory to generate an equivalent circuit to represent the event by using voltage and current synchrophasor measurements. In accordance with an exemplary embodiment, the method does not require making any hypothesis about the location of the event. It locates the source of the event rather directly and by solving an optimization problem. In accordance with an exemplary embodiment, the source location of each event is identified using micro-PMUs, as opposed to waveform sensors.

In accordance with an exemplary embodiment, the method can utilize data from as few as only two micro-PMUs, that are installed at the beginning and at the end of a feeder, to locate the source of an event, anywhere along the main feeder. If additional micro-PMUs are available also at the end of the laterals, the disclosed method can pinpoint the event source location also along the laterals.

In accordance with an exemplary embodiment, the method makes use of not only magnitude measurements but also phase angle measurements that are obtained by micro-PMUs. This is an important feature, because so far, the role of phase-angle measurements is still not fully understood in many applications in the literature on micro-PMUs. The importance of using phase angle measurements is discussed both analytically, and through case studies.

In accordance with an exemplary embodiment, the method works based on measurement differences. This feature can help alleviate constant errors in instrumentation channel, such as errors at current transformers (CTs) and potential transformers (PTs), which are often orders of magnitude higher than the errors in the micro-PMU device itself. As a result, the performance of the method is robust with respect to typical measurement errors.

Event Source Location Identification Method

In accordance with an exemplary embodiment, the method for locating the source of an event in a distribution feeder is disclosed. Throughout this section, two micro-PMUs are installed on the feeder.

Background: Compensation Theorem

As set forth above, an event in an electric circuit can change all or a subset of nodal voltages and branch currents along the circuit. According to the compensation theorem, once an element changes in a circuit, the amount of changes in nodal voltages and branch currents can be obtained through an equivalent circuit. In such equivalent circuit, the element that has changed is replaced with a current source that injects current at a level equal to the amount of change in the current going through the element; and all sources are replaced with their internal impedances.

The importance of the compensation theorem in this disclosure is that the analysis of an event through equivalent circuit is easier than through the original circuit.

Figure 1B:
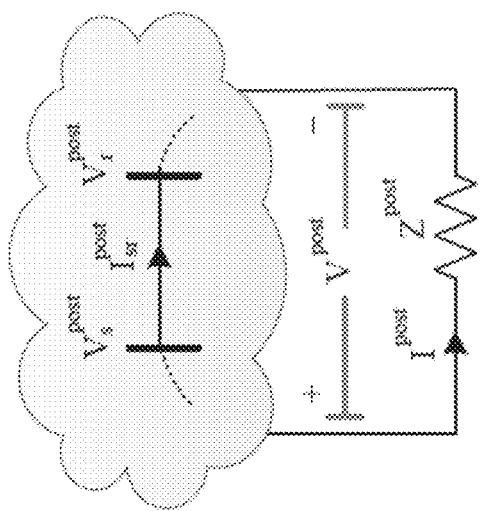
Figure 1C:
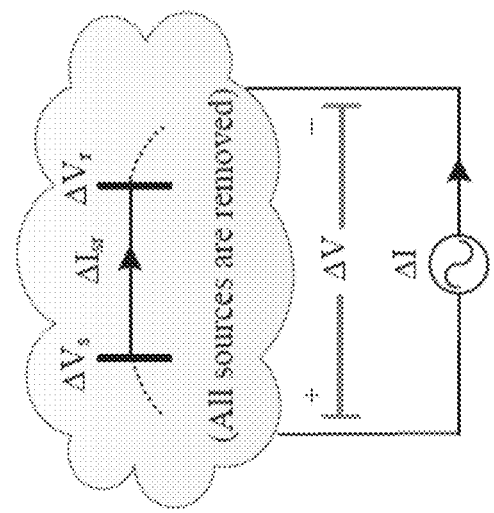

An example is shown in FIGS. 1(a)-1(c). The event in this example is a change in impedance Z. The pre-event impedance is denoted by $Z^{pre}$, as in FIG. 1(a). The post-event impedance is denoted by $Z^{post}$ as in FIG. 1(b). Let $I^{pre}$ and $I^{post}$ denote the current drawn by the element before and after the event, respectively. Based on the compensation theorem, the equivalent circuit of this network can be obtained by replacing the impedance element that caused the event with current source $$\Delta I = I^{post} - I^{pre}, \tag{11}$$

and all sources with their internal impedances. The equivalent network, shown in FIG. 1(c), can then be used to analyze the changes of the nodal voltages and branch currents:

$$\Delta V_s = V_s^{post} - V_s^{pre}, \tag{12}$$

$$\Delta I_{sr} = I_{sr}^{post} - I_{sr}^{pre}, \tag{13}$$

where subscriptions s and r denote two arbitrary neighboring nodes. Next, an application of the compensation theorem to help locate the source of events is disclosed.

Pre-Step: Event Detection

Before identifying the location of an event, one first must become aware of the occurrence of such event. Thanks to the recent advances in applying data-driven techniques to micro-PMU data, there already exist effective methods to detect the presence of the event. The event detection process is continuously carried out based on such algorithms. Once the occurrence of an event is detected, the next step is to use an algorithm that can identify the location of the root cause of the event; as we will describe next.

Step 1: Identifying the Region of the Event Source

For example, consider a distribution feeder, such as in FIG. 2. Suppose two micro-PMUs are installed on this feeder. There are n buses between the two micro-PMUs. These buses may or may not have laterals. The voltage and current at the downstream and upstream of the feeder are recorded by the two micro-PMUs. An event may occur in one of the following three regions:

upstream of micro-PMU u,
downstream of micro-PMU d,
between micro-PMU u and micro-PMU d.

In order to determine the region of the event source, next, the equivalent upstream impedance of the feeder seen by micro-PMU u and the equivalent downstream impedance of the feeder seen by the micro-PMU d are defined as:

$$Z^u \triangleq \frac{\Delta V^u}{\Delta I^u} \tag{14}$$

$$Z^d \triangleq \frac{\Delta V^d}{\Delta I^d}, \tag{15}$$

respectively, where $\Delta V^u$ and $\Delta V^d$ indicate the difference between the pre-event and post-event voltage phasors, captured by micro-PMUs u and d. Also, $\Delta I^u$ and $\Delta I^d$ denotes the difference in current phasors, captured by these micro-PMUs. Note that the direction of current that is measured by the two micro-PMUs is the opposite of each other, as shown in FIG. 2; micro-PMU u measures the current flowing towards upstream, i.e., to the left, while micro-PMU d measures the current flowing towards downstream, i.e., to the right.

Based upon the analysis, the real parts of $Z^u$ and $Z^d$ determine the region of the event source. If $\text{Real}\{Z^u\}$ is negative, then the event source is located in the upstream of micro-PMU u. Similarly, if $\text{Real}\{Z^d\}$ is negative, then the event source is located in the downstream of micro-PMU d. Finally, if $\text{Real}\{Z^u\}$ and $\text{Real}\{Z^d\}$ are both positive, then the event source is located between the two micro-PMUs.

Now, suppose micro-PMU u is installed at the feeder-head at the distribution substation. Also, suppose micro-PMU d is installed at the terminal bus, for example, at the end of the feeder. In that case, if the region of the event source is the upstream of micro-PMU u, then the event has a root-cause outside the distribution feeder of interest, such as in the transmission system. If the region of the event source is the downstream of micro-PMU d, then the source is simply on the terminal bus. Therefore, for the rest of this section, our focus is on locating the source of the event when it occurs somewhere across the distribution feeder, for example, between the two micro-PMUs.

Step 2: Forward Nodal Voltages Calculation

Suppose the event source is connected to bus k, where $k \in \{1, \ldots n\}$. Based on the compensation theorem, a current source with current $\Delta I_k$ can be placed at bus k to create an equivalent circuit. The nodal voltages and branch currents on this equivalent circuit at the buses where the two micro-PMUs are installed are equal to the changes in nodal voltages and branch currents, obtained as in (12) and (13), respectively.

Next, by using the measurements from micro-PMU u, together with pseudo-measurements, and by successively applying the Kirchhoff Voltage Law (KVL), one can obtain:

$$\begin{aligned} \Delta V_1^f &= \Delta V^u \\ \Delta V_2^f &= \Delta V_1^f + (\Delta I^u + \Delta I_1^f)Z_1 \\ &\vdots \\ \Delta V_n^f &= \Delta V_{n-1}^f + (\Delta I^u + \Delta I_1^f + \cdots + \Delta I_{n-1}^f)Z_{n-1}, \end{aligned} \tag{16}$$

where $\Delta V_i^f$ denotes the calculated nodal voltage at bus i, and $\Delta I_i^f$ denotes the calculated current injection at bus i. Superscript f indicates the fact that the quantities are obtained using forward calculation. Without loss of generality, we assume that all loads are constant-impedance; hence the current injection at node i is calculated as $$\Delta I_i^f = Y_i \Delta V_i^f, \tag{17}$$

where $Y_i$ indicates the equivalent admittance of lateral i and is considered as pseudo-measurements. By replacing (17) in (16), one can start from the measurements of micro-PMU u and sequentially calculate $\Delta V_1^f, \Delta V_2^f, \ldots, \Delta V_n^f$.

Other types of loads, namely constant-current and constant-power loads, can also be formulated and similarly integrated into the model using adequate pseudo-measurements.

Step 3: Backward Nodal Voltages Calculation

In a similar manner, one can start from sensor bus d, use the measurements of micro-PMU d, together with pseudo-measurements, and successively apply KVL in order to obtain:

$$\Delta V_n^b = \Delta V^d \quad (18)$$

$$\Delta V_{n-1}^b = \Delta V_n^b + (\Delta I^d + \Delta I_n^b)Z_{n-1}$$

$$\vdots$$

$$\Delta V_1^b = \Delta V_2^b + (\Delta I^d + \Delta I_n^b + \cdots + \Delta I_2^b)Z_1,$$

where superscript b indicates that the intended voltage or current phasor is obtained using backward calculation. Again, by assuming that all loads are constant-impedance, the current injection at node i is calculated as $$\Delta I_i^b = Y_i \Delta V_i^b. \quad (19)$$

By replacing (19) in (18), one can start from micro-PMU d and sequentially calculate $\Delta V_n^b, \Delta V_{n-1}^b, \ldots, \Delta V_1^b$.

Step 4: Voltage Comparison

In computations (16) and (18), it is assumed that at each bus the current injection can be obtained from the production of nodal voltage and bus admittance. This is a valid assumption at all buses, except for bus k in which the event occurs. Recall from the compensation theorem that at this bus, a current source injects $\Delta I_k$ into the equivalent circuit of the feeder and therefore, the production of voltage and bus admittance is no longer a correct indication of the bus current. As a result, we can make the following distinctions across the calculated nodal voltages:

$$\{\underbrace{\Delta V_1^f, \cdots, \Delta V_{k-1}^f, \Delta V_k^f}_{\text{correct}} \underbrace{\Delta V_{k+1}^f, \cdots, \Delta V_n^f}_{\text{incorrect}}\} \quad (20)$$

$$\{\underbrace{\Delta V_1^b, \cdots, \Delta V_{k-1}^b, \Delta V_k^b}_{\text{incorrect}}, \underbrace{\Delta V_{k+1}^b, \cdots, \Delta V_n^b}_{\text{correct}}\}.$$

The fundamental observation in (20) is that the calculated voltage at bus k in both backward and forward nodal voltage calculations is a correct value. In other words, $\Delta V_k^f$ and $\Delta V_k^b$ are essentially equal, because if they are not equal, then at least one of them must be incorrect, which is a contradiction.

Next, the discrepancy of the nodal voltages obtained from both calculations across all buses is defined as:

$$\Phi_i = |\Delta V_i^f - \Delta V_i^b|, \forall i, \quad (21)$$

where $\Delta V_i^f$ and $\Delta V_i^b$ are as in (16) and (18), respectively. From (20), among all buses, the voltage at bus k in the two nodal voltage calculation methods must be almost equal; hence, it is expected that $\Phi_k$ has the minimum value among all buses. Therefore, the event source location can be obtained as:

$$k = \arg \min_i \Phi_i. \quad (22)$$

The proposed Event Source Location Identification (ESLI) method is summarized in Algorithm 2. First, the event is detected. Then, the method is used to identify the region of the event source. Algorithm 2 reaches a conclusion if the event source is outside of the feeder or at the terminal bus in Step 1. Otherwise, it goes through the forward and backward nodal voltage calculations in Step 2 and Step 3, respectively. Then, the exact event source location is identified in Step 4.

---

Algorithm 2 - ELSI with two Micro-PMUs

---

Input: Micro-PMUs measurements, pseudo-measurements.
Output: The location of the event source.
Pre-Step: An event is detected.
Step1:
    Obtain $Z^u$ and $Z^d$, as in (14) and (15), respectively.
    if Real$\{Z^u\}$ < 0, then
        The event source is outside the feeder of interest.
    else if Real$\{Z^d\}$ < 0, then
        The event source is the terminal bus.
    else
Step2:
    Obtain $\Delta V_i^f$ using (16).
Step3:
    Obtain $\Delta V_i^b$ using (18).
Step4:
    Obtain $\Phi_i$ using (21).
    Obtain the event source location k using (22).
    return k
end if

---

Extension to the Case with Arbitrary Number of Micro-PMUs

So far, the case when only two micro-PMUs are available has been analyzed. In this section, the method is extended to incorporate the case with m≥2 micro-PMUs (i.e., two or more micro-PMUs). Again, one micro-PMU is installed at the feeder-head to distinguish the events that are originated at the distribution system from those that are originated at the transmission system using the method. Other micro-PMUs are installed at the end of the main and a subset of laterals.

Figure 12:
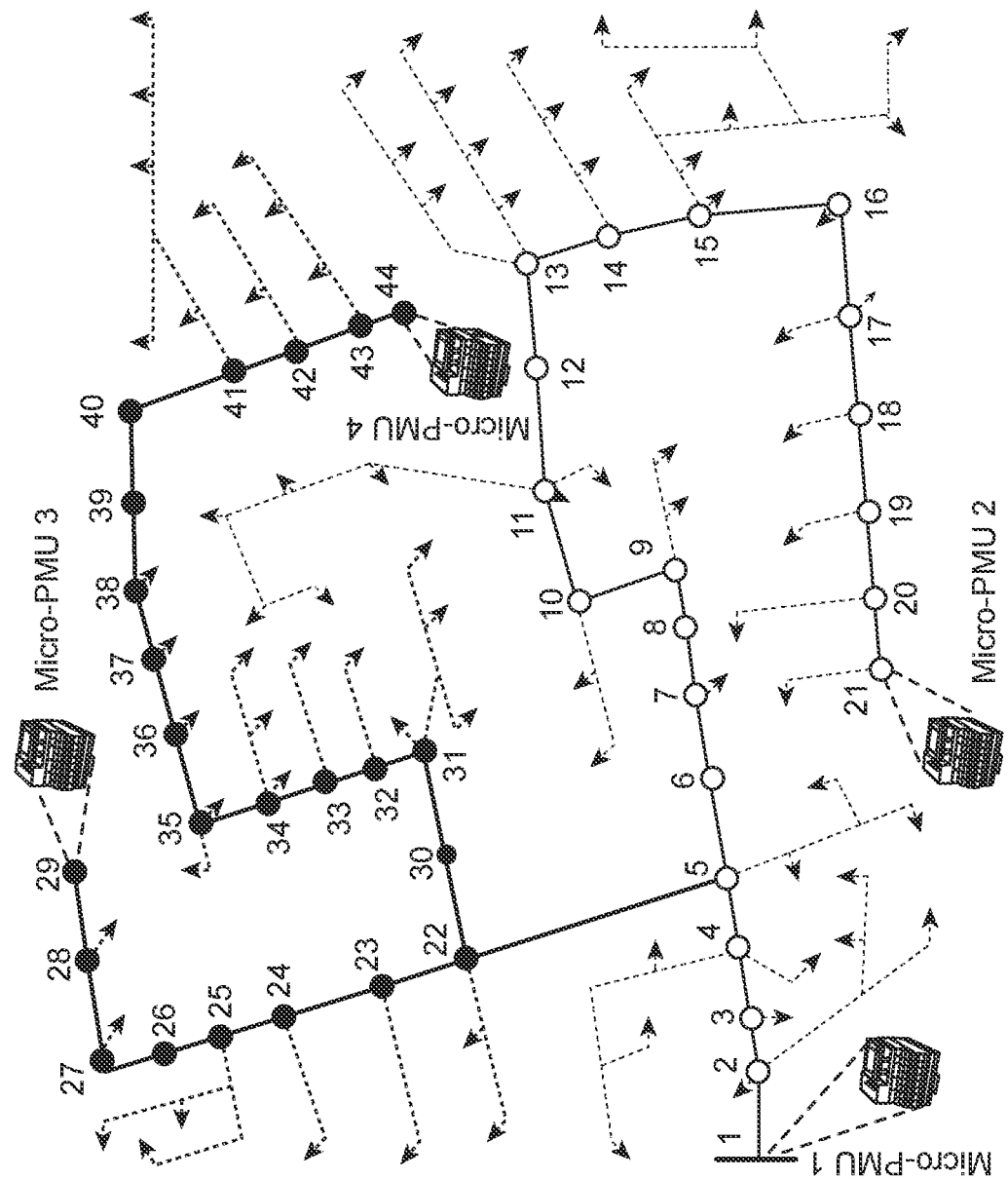
FIG. 12 illustrates an IEEE 123 bus system equipped with 4 micro-PMUs, and wherein if, for example, only micro-PMUs 1 and 2 are available, then buses 1 to 21 become observable, and if, for example, only micro-PMUs 3 and 4 also become available, then buses 22 to 44 also become observable.

Next, the concept of using minimum spanning tree (MST) is described, which is defined as the path that connects all micro-PMUs across the distribution feeder. In order to create an MST in a distribution feeder, at least two micro-PMUs are required. Assume micro-PMUs 1 and 2 are installed on the IEEE 123 bus test system, as shown in FIG. 12.

The MST for this configuration includes the buses between these two micro-PMUs, i.e. buses 1 to 21, which buses are referred to as MST buses. The number of MST buses in this example is n=21.

The location of an event is identified on MST buses, which indicates that the event has occurred either on the identified MST bus itself, or on a lateral that stems from this identified MST bus. For instance, if bus 16 is identified as the location of an event, then we are confident that the event has indeed occurred at this bus, because bus 16 does not have a lateral. However, if bus 5 is identified as the location of an event, then the actual event location could be bus 5 itself or somewhere on the lateral that stems from bus 5, i.e., buses 22 to 44 which are shown in red in FIG. 12. This issue can be resolved only if additional micro-PMUs are installed on this network. For instance, as shown in FIG. 12, one can increase the number of MST buses to n=29, including buses 22 to 29, if we install micro-PMU 3 at bus 29. Similarly, by adding micro-PMU 4 at bus 44, we can turn buses 30 to 44 into MST buses.

In order to achieve full observability, i.e., to turn all buses into MST buses to identify the exact event bus location when it occurs wherever on any lateral, we must to install at least a total of one plus the number of laterals micro-PMUs; one at the substation and one at the end of each lateral. However, such full observability on each and every lateral may not be necessary in practice. In fact, in many cases, it is sufficient to identify the lateral that hosts the event; rather than the exact bus on such identified lateral. For example, by increasing the number of micro-PMUs from 2 to 4 in FIG. 12, the system observability can be improved, which is sufficient for practical purposes to identify most major events.

To obtain an alternative and more systematic approach, let $\Delta V_i^j$ denote the voltage phasor of MST bus i that is calculated by using the measurements of micro-PMU j, together with pseudo-measurements, and by successively applying KVL starting from micro-PMU j in the equivalent circuit, just like in (16) and (18). Next, in accordance with an exemplary embodiment, one can use the discrepancy among the calculated nodal voltage phasors based on all measurements from different micro-PMUs and obtain the event source location by solving the minimization in (22) but with the following updated objective function:

$$\Phi_i = \sum_{j=1}^{m-1} \sum_{s=j+1}^{m} |\Delta V_i^j - \Delta V_i^s|, \forall i. \quad (23)$$

where m shows the number of micro-PMUs deployed across the power distribution system. Indexes j and s are associated with micro-PMUs 1, ..., m; and index i is associated with buses 1, ..., n on the minimum spanning tree.

Specifically, for each pair of micro-PMUs j and s, the expression in (23) calculates the discrepancy of the nodal voltages obtained from the forward and backward calculations that starts from micro-PMU j and ends at micro-PMU s; and vice versa. In other words, for a given pair of micro-PMUs j and s, the expression in (23) is identical to the expression in (21). Accordingly, the expression in (23) simply repeats and combines such discrepancy calculations across all possible pairs of micro-PMUs j and s. The combination is achieved through the two summation operators in this equation. The rest of the analysis is exactly the same as expressed for two micro-PMUs. Algorithm 3 can be updated to cover the case with multiple micro-PMUs, as shown in Algorithm 3.

---
Algorithm 3: ESLI with Multiple Micro-PMUs
---
Same as in Algorithm 2, but replace step4 with:
   Step4:
      Obtain $\Delta V^j$ for any micro-PMU j similar to (16) and (18).
      Obtain vector $\Phi$ using (23).
---

Importance of Measuring Phase Angle

In this section, the importance of using not only magnitude measurements but also phase angle measurements that are obtained by micro-PMUs is disclosed. The goal is to analytically examine the need for using an advanced sensor such as micro-PMU, as opposed to using ordinary RMS-value sensors.

Figure 13B:
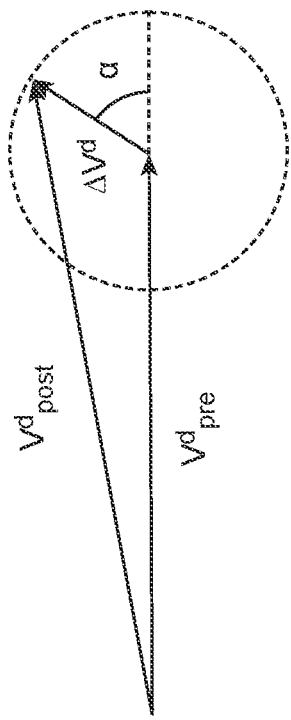
FIGS. 13(a) and 13(b) illustrate the importance of measuring phase angles for phasor $V_{pre}^d$ and $V_{post}^d$ depends on angle α, and wherein (a) is an equivalent circuit, and (b) is a Voltage phasor diagram.
Figure 13A:
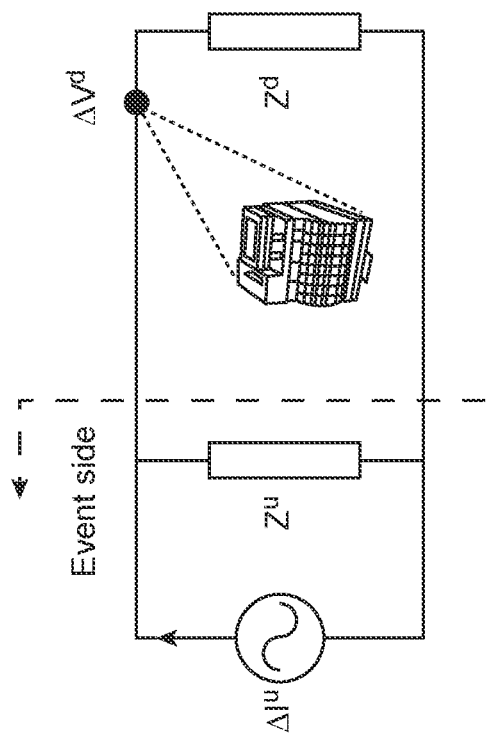

Consider an event and suppose the changes in voltage at a given sensor location are captured by a micro-PMU as shown in FIG. 13(a). Suppose the event occurs on the upstream of the micro-PMU, as indicated by placing the current source on the left hand side of the micro-PMU in FIG. 13(a). Note that, the voltage difference $\Delta V^d$ is a phasor. It is obtained as $$\Delta V^d = \frac{Z^u Z^d}{Z^u + Z^d} \Delta I^u = Z^{eq} \Delta I^u. \quad (24)$$

If the magnitude of $\Delta V^d$ is fixed, then the post-event phasor would vary on the dashed circle, changing angle α, as shown in FIG. 13(b). The exact value of α depends on the type of event, such as load switching, capacitor bank switching, DERs switching, faults, etc., and it can be shown that:

$$\alpha = \angle Z^{eq} + \angle \Delta I^u. \quad (25)$$

Note that, the cosine of $\angle Z^{eq}$ can be loosely interpreted as the power factor of the event-induced equivalent circuit.

If the phase angle difference α is exactly zero or 180°, for example, if the post-event voltage phasor is in line with the pre-event voltage phasor, then it is sufficient to measure only the magnitude of voltage in order to use the analysis in this disclosure. From (25), for a to be zero or 180°, one must have either $$\angle \Delta I^u = -\angle Z^{eq} \text{ or } \angle \Delta I^u = \pi - \angle Z^{eq}. \quad (26)$$

In such special cases, one can use a standard RMS-based voltage sensor, as opposed to a micro-PMU, in order to identify the location of the event using our method.

If neither of the conditions in (26) hold, then measuring phasor angle, for example, the use of micro-PMUs, is necessary. However, the extent of such necessity depends on the value of α. Of interest are those events that only change the voltage phase-angle but not the voltage magnitude, i.e. when either $$\alpha = \pi/2 + \arcsin(\Delta V_d / 2V_{pre}) \quad (27)$$

$$\text{or } \alpha = -\pi/2 - \arcsin(\Delta V_d / 2V_{pre}). \quad (28)$$

If any of the above conditions hold, then measuring voltage magnitude alone, such as by using standard RMS-based voltage sensors, is simply useless for the purpose of even location identification. One must use micro-PMUs instead.

In practice, one often has $\Delta V^d \ll V_{pre}^d$ for most PQ events. In that case, the arcsin terms in (27) and (28) would be negligible. From this, together with (25), the conditions in (27) and (28) can be approximated as $\angle \Delta I \approx -\angle Z^{eq} \pm \pi/2$.

Case Studies: IEEE Test Network

Again consider the IEEE 123-bus test system in FIG. 12, where the parameters are as in Radial distribution Test Feeders, Distribution System Analysis Sub-committee Rep. 2017 [Online} Available, http://ewh.ieee.org/soc/pes/dsa-com/testfeeders.html. This network has several laterals and sub-laterals, which feed different types of balanced and unbalanced loads. Four micro-PMUs are installed at buses 1, 21, 29, and 44, as marked in FIG. 12. The efficiency and robustness of the proposed ESLI method is tested on this network for several predefined event scenarios. In each scenario, the discrepancy measure $\Phi_k$ is calculated at each bus k=1, 2, . . . , 44 by utilizing a three-phase load flow method in MATLAB for pre-event and post-event time-stamps.

Examining Four Different Event Scenarios

Case I—

Capacitor Bank Switching at Bus 15: Capacitor bank switching is a persistent but minor PQ event in power distribution systems. Commonly, capacitor banks are switched by voltage regulated controllers. Since most capacitors do not have built-in monitoring systems, utilities need to perform manual patrol and inspections to verify proper operation of their capacitors or to identify any PQ event that is caused by any incipient failure with volt/var control switching. Alternatively, we can use the proposed ESLI method to remotely monitor the operation of capacitor banks. As an example, suppose a 600 kVAR capacitor is switched off at bus 15. The ESLI algorithm is used to obtain $\Phi_k$ for k=1, 2, . . . , 44 based on three different micro-PMUs data availability scenarios.

First, suppose data is available only from two micro-PMUs, i.e., micro-PMUs 1 and 2. The results are shown in FIG. 14(a). In this case, the MST includes buses 1 to 21. Since the location of the capacitor, i.e., bus 15, is on the MST, the event source location is correctly identified at the minimum of the discrepancy bar chart in FIG. 14(a). Note that, since buses 22 to 44 are not MST buses due to the absence of micro-PMUs 3 and 4, they do not carry separate discrepancy measures; they rather take the same discrepancy measure as MST bus 5.

Second, suppose the data is available from Micro-PMUs 1, 2, and 3. In this case, the MST expands to include buses 22 to 29. The obtained results are presented in FIG. 14(b).

Finally, suppose the data is available from all four micro-PMUs. In that case, the MST includes all buses 1 to 44. The results are shown in FIG. 14(c). One can conclude that in Case I, the use of micro-PMUs 3 and 4 is not necessary, because the MST already includes the event bus 15 even if only micro-PMUs 1 and 2 are available. Although, having redundancy measurements could help if the measurements are noisy.

Case II—

Figure 15A:
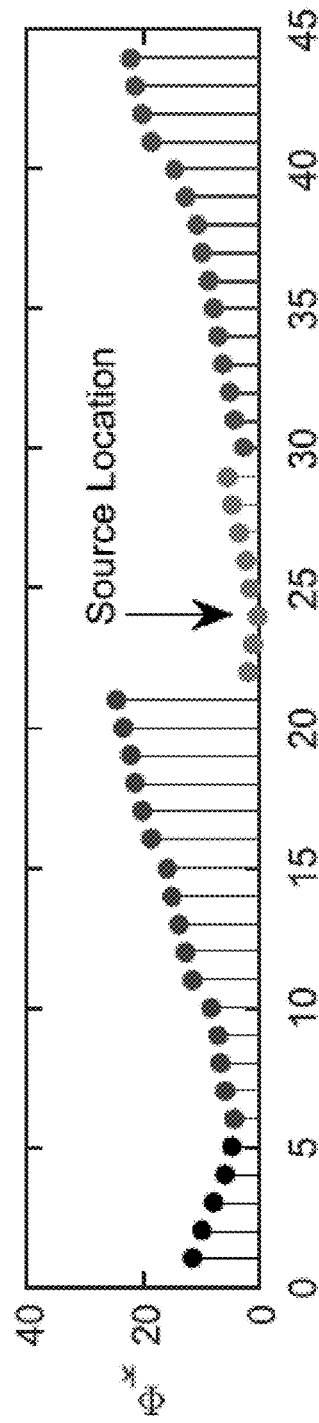
FIGS. 15(a)-15(c) illustrate results for Cases II to IV based on the IEEE 123-bus test system using data from four micro-PMUs, wherein (a) Case II, (b) Case III, and (c) Case IV.

Load or DER Switching at Bus 24: Suppose a single-phase 40 kW+20 kVAR load switches on at bus 24, causing a small voltage sag. The source of such event can be remotely located using micro-PMU data. The results are shown in FIG. 15(a). The minimum of the discrepancy measure $\Phi_k$ provides the correct event source location at bus 24. Here, one assumes that all four micro-PMUs are available. If micro-PMU 3 is not available, then bus 22 is selected as the event source location, because in that case bus 24 is not on the MST.

Case III—

Figure 15B:
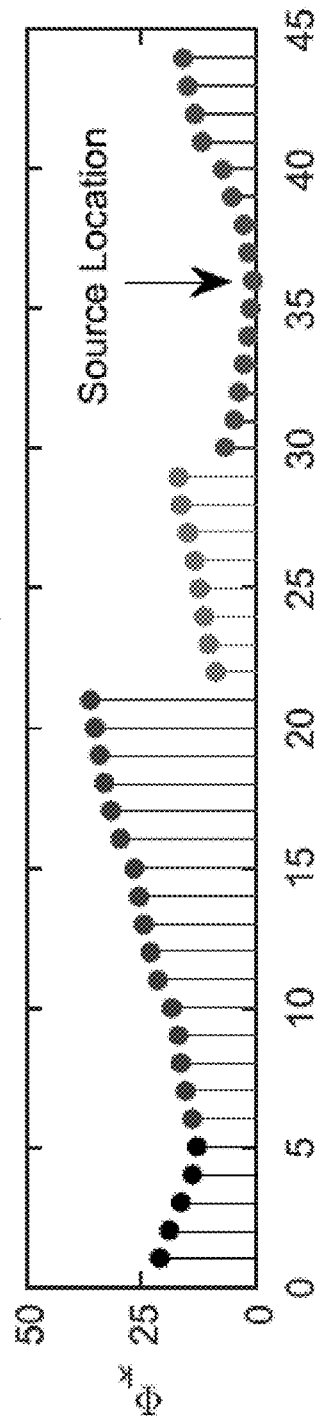

High Impedance Fault at Bus 36: High impedance faults may not interrupt service; but they must be identified to isolate the faulted area due to safety. Suppose a single-phase high impedance fault with 100Ω fault resistance occurs at bus 36. The results for this event are shown in FIG. 15(b). The event source location is correctly identified at bus 36.

Case IV—

Figure 15C:
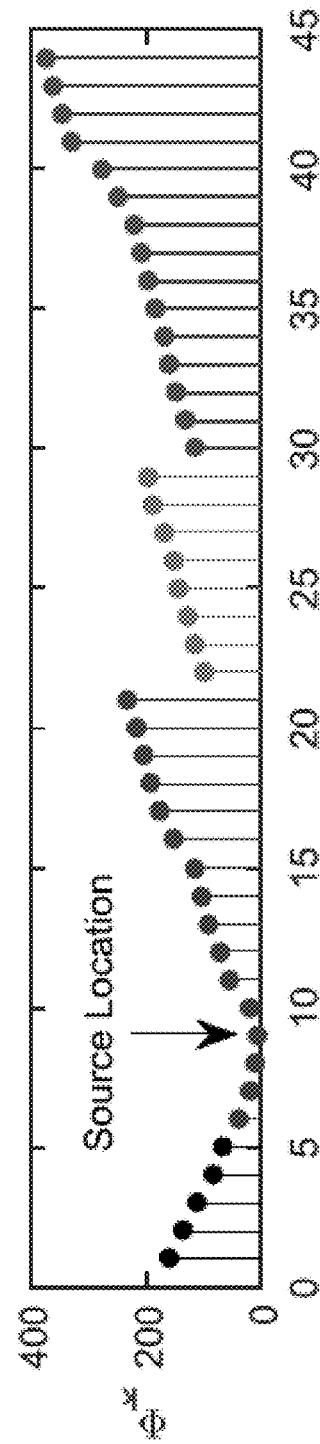
Figure 16A:
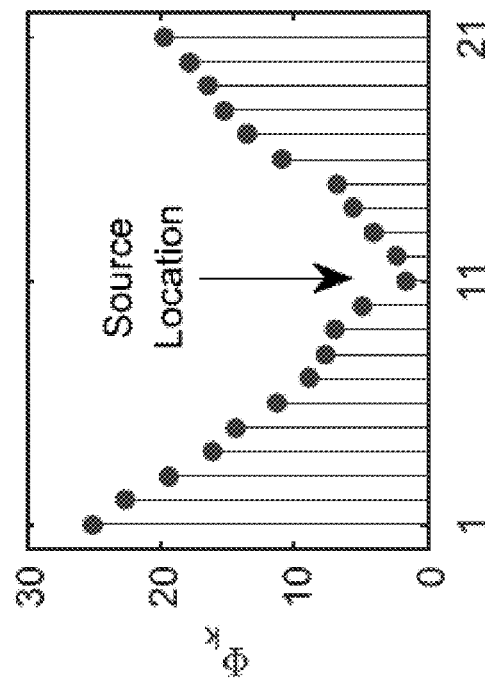
FIGS. 16(a)-16(d) illustrate discrepancy measurements from the cases in Section V-B, wherein (a) Case A using micro-PMU data, (b) Case B using micro-PMU data, (c) Case A using RMS-value sensor data, and (d) Case B using RMS-value sensor data.
Figure 16B:
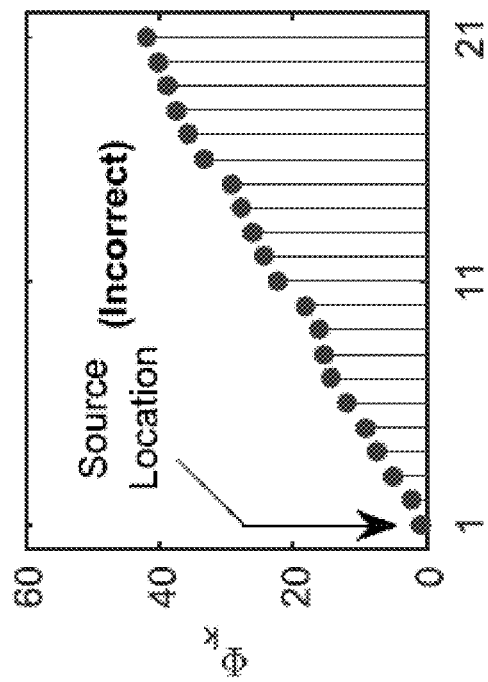
Figure 16C:
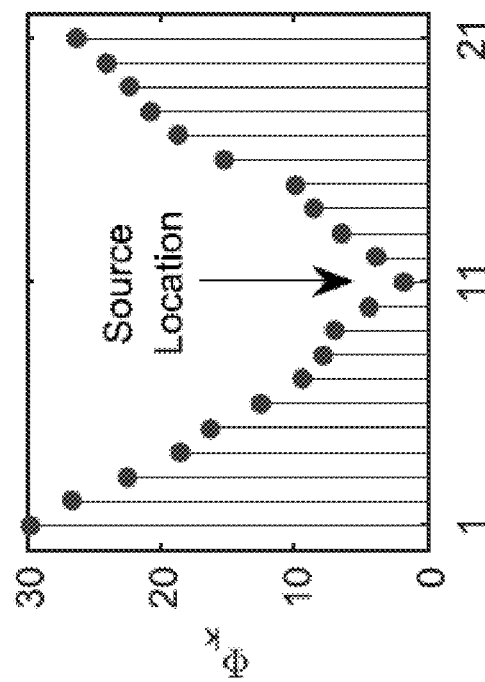
Figure 16D:
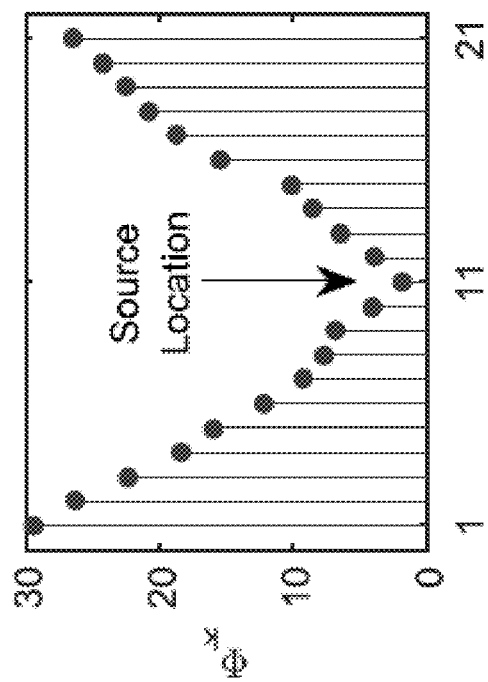

Low Impedance Fault at Bus 9: Low impedance faults are often reliability events which require operating the protection devices. Suppose a three-phase fault with 5Ω fault resistance occurs at bus 9. The results of applying the ESLI algorithm are shown in FIG. 15(c). Again, one can see that the minimum of the discrepancy measure $\Phi_k$ across k=1, . . . , 44 correctly indicates the event source location at bus 9.

It is interesting to compare the extent of discrepancy value Case IV with those in Cases I and II, where the event was of minor PQ type. The discrepancy is much higher for the major reliability event in Case IV. For example, there is a much greater margin of accuracy in identifying the correct location for reliability events; therefore, it is less likely for the location of a reliability event to be identified incorrectly.

Importance of Using Phase Angle Measurements

In accordance with an exemplary embodiment, the importance of using phase angle measurements for the analysis in this disclosure depends on the angle α that the event creates between $V_{pre}^d$ and $V_{post}^d$, see FIG. 13(b). In this section, two cases are compared, namely Case A and Case B, to further explain this concept. Without loss of generality, suppose only two micro-PMUs, i.e., micro-PMUs 1 and 2 are available. The two events are defined as follows:

Case A: A 40 kW+80 kVAR load is switched on at bus 11. This results in $V_{pre}^d=2332.1\angle 5.1183°$ and $V_{post}^d=2296.6\angle 5.2583°$. If a micro-PMU is used, then we can measure $\Delta V^d=35.9\angle 176°$. If an ordinary RMS-value sensor is used, then we can measure $\Delta V^d=-35.5$.

Case B: A 80 kW-40 kVAR load is switched on at bus 11. This results in $V_{pre}^d=2332.1\angle 5.1183°$ and $V_{post}^d=2331.2\angle 5.8693°$. If a micro-PMU is used, then we can measure $\Delta V^d=30.6\angle 97°$. If an ordinary RMS-value sensor is used then we can measure $\Delta V^d=-0.9$.

The results of applying the ESLI algorithm are shown in FIGS. 16(a)-16(d). In accordance with an exemplary embodiment, one can see that both sensors can correctly identify the location of the event in Case A. However, an ordinary RMS-value sensor can barely notice the event in Case B. Accordingly, it cannot help identify the location of the event, see FIG. 16(d). One must use data from micro-PMUs instead in order to identify the event in Case B.

Discrepancy Based on Magnitude Vs. Phasor Comparison

Figure 17B:
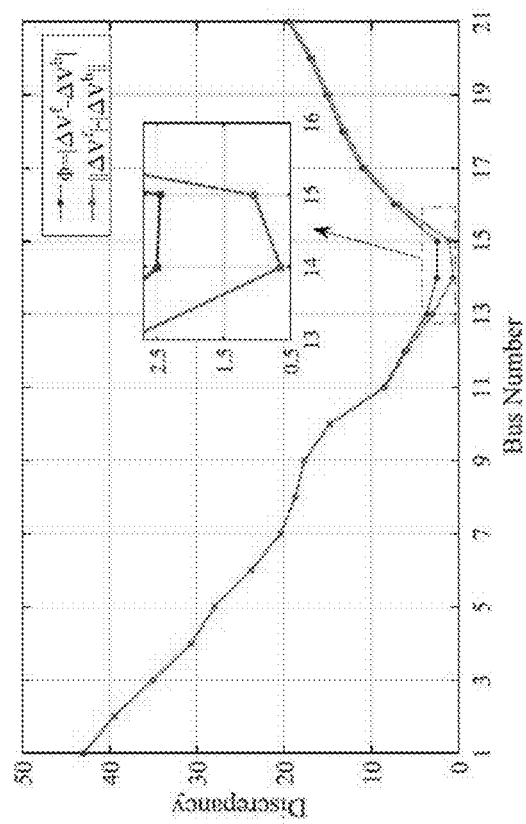
FIGS. 17(a)-17(b) illustrate the importance of calculating discrepancy based on phasors in case of a capacitor bank event location identification, wherein (a) incorrect identification of event location based on examining the intersection of differential voltage curves for voltage magnitude, and (b) comparing the differential voltage discrepancy curves based on voltage phasors, as in (21), versus magnitude only, as in (29).
Figure 17A:
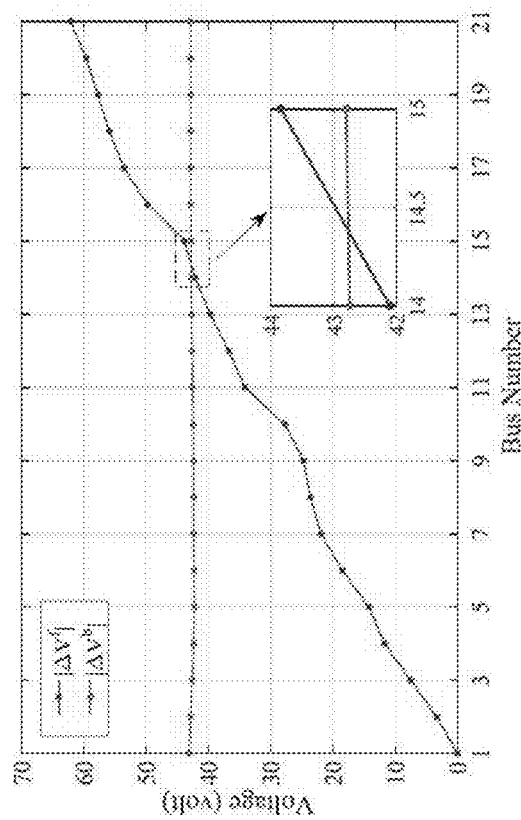

As expressed in (21), the discrepancy index in our analysis is obtained by conducting a comparison between the two sets of differential voltage phasors obtained from the backward and forward steps, i.e., $\Delta V^f$ and $\Delta V^b$. Alternatively, one may attempt to identify the location of the event by examining the intersection of the two curves that are formed by plotting the magnitude of the forward and backward differential voltages. As an example, consider the capacitor bank event (Case I), in which the pseudo-measurements are perturbed with some practical level of errors. In FIG. 17(a), the magnitude of the differential voltage in the forward nodal voltage calculation, i.e., $|\Delta V^f|$; as well as the magnitude of the differential voltage in the backward nodal voltage calculation, i.e., $|\Delta V^b|$, are plotted. We can see that the intersection between the two voltage curves occurs between buses 14 and 15. Such intersection is closer to bus 14; as it can be confirmed in the magnified portion of this figure. Therefore, bus 14 would be identified as the event bus if intersection-based method is used. However, the correct event bus in this example is bus 15.

In accordance with an exemplary embodiment, the problem with the intersection-based method in this example is that it essentially relies only on the magnitude of the differential voltage and ignores their phasor characteristics. This issue can be better understood by using the curves in FIG. 17(b). First consider the curve for $$\||\Delta V^f|-|\Delta V^b|\|. \tag{29}$$

The intersection-based method in the nodal calculation that we explained in the previous paragraph is equivalent to obtaining the minimum of the curve for the expression in (29). Such minimum would result in incorrectly identifying bus 14 as the event bus. Next, consider the curve for the proposed discrepancy index in (21). As seen, the minimum of this curve occurs at bus 15, which is the correct event bus.

In accordance with an exemplary embodiment, the difference between the two approaches becomes evident by comparing (29) and (21), where the former is the discrepancy based on magnitude only; while the latter is the discrepancy based on phasors. Obtaining such phasor-based discrepancy is in fact one of the advantages of using phasor measurements as opposed to RMS-based measurements.

Analysis of Sensitivity and Robustness

In practice, the utility's knowledge about system parameters is not perfect and measurements are not precise. Uncertainty varies for different types of parameters and measurements. Nevertheless, the robustness of the proposed ESLI algorithm can be examined against any given level of parameter inaccuracy. Here, the Monte Carlo approach is used to generate different scenarios based on the given level of parameter error.

1) Errors in Distribution Lines Impedances:

Table VI (FIG. 18) shows the results when there are errors in the supposedly known impedances of distribution lines. For line impedance errors with 5% standard deviation (SD), nearly 99.9% of the event source locations are identified correctly. Even in those 0.1% of the cases where the event source is located incorrectly, the identified location is an immediate neighboring bus of the bus where the event occurs. As the error increases, the results still demonstrate an overall satisfying performance in event source location identification. For an impedance error with 25% SD, which is beyond any normal level of error in practice, either the correct event bus itself or its immediate neighboring bus is identified in 49.6+36.7=86.3% of the cases.

2) Errors in Pseudo-Measurements:

A similar sensitivity analysis can be done with respect to the pseudo-measurements on background power injections, i.e., loads and distributed generations. Of course, this would be a concern only if the distribution system is not equipped with smart meters. The results are shown in Table VII (FIG. 19). It can be seen that, even with errors with as high as 100% SD, either the correct event bus or its immediate neighboring bus is identified almost all the time.

3) Errors in Measurements:

In principle, two sources of error can be considered in the context of this disclosure: the error in the micro-PMU device itself; as well as the error in the instrumentation channel. The latter is associated with the errors due to the CTs, PTs, control cables, and burden at the input of the micro-PMU. Based on various field experience and given the fact that micro-PMUs have very high precision with typical accuracy at 0.01% in magnitude and 0.003° in angle; it is only the error in the instrumentation channel that is of concern in practice and must be considered. Interestingly, the errors in instrumentation channel, especially for distribution-level PTs and CTs, are large but stable. It means that the instrumentation channel errors are roughly constant for consecutive measurements that are made over a short period of time. As a result, the measurement differences at the same location, such as $\Delta V$ and $\Delta I$ in this study, are not significantly affected by the instrumentation channel errors.

To discuss the effectiveness of the method against the measurement errors, two scenarios are examined in this section to identify the location of a non-fault event and that of a fault event. It is assumed that the CTs/PTs used for non-fault events are of Measurement 0.5-Class; and the CTs/PTs used for fault events are of Protection 3-Class. In both scenarios, micro-PMUs are assumed to have their typical manufacturer-reported accuracy at 0.01% in magnitude and 0.003° in angle.

The results associated with the non-fault and fault events are shown in Table VIII (FIG. 20) and Table IX (FIG. 21), respectively. These results demonstrate the effectiveness of our method against typical errors in measurements. In particular, when it comes to major events such as a 5% load switching (Table VIII (FIG. 20)) or a low-impedance fault with resistance 5Ω (Table IX (FIG. 21)), the measurement errors do not at all influence the accuracy of event location identification. However, when it comes to minor events such as a 0.5% load switching (Table XIII (FIG. 20)) or a high-impedance fault with resistance 100Ω (Table IX (FIG. 21)), the measurement errors may slightly affect the performance, because such minor events cause only relatively small variations in measurements which could be comparable with measurement error.

4) Event Significance:

If an event is relatively small, the disclosed method may no longer be able to identify the event location; because the information for such event could be lost within the errors in measurements. However, one may ask: do we really need to identify the location of such minor events? Nevertheless, it is reasonable to examine how the accuracy of the results are affected based on the size of the event. Table X (FIG. 22) shows the efficiency of our method for various events which cause different voltage and power variations. The error in measurement in each scenario is given based on the percentage error in magnitude and the actual degree error in phase angle. As can be seen, the reliable margin of measurements variation for running the method depends on the accuracy of the micro-PMUs. The margin of measurement variations decreases as we improve the accuracy of micro-PMUs.

Performance Comparison

In this section, the performance of the disclosed method with that of a method that works based on a state estimation method. In order to have a fair comparison, both the disclosed method and the state estimation-based method were applied to the same practical test scenario, where both methods have access to live data only from two micro-PMUs to pin point the location of cap bank switching (Case I) among buses 1 to 21, as shown in FIG. 12. As it is shown in FIG. 14(a), the disclosed method can efficiently localize this event, where two micro-PMUs are installed at buses 1 and 21.

Figures 22, 23A, 23B, 23C:
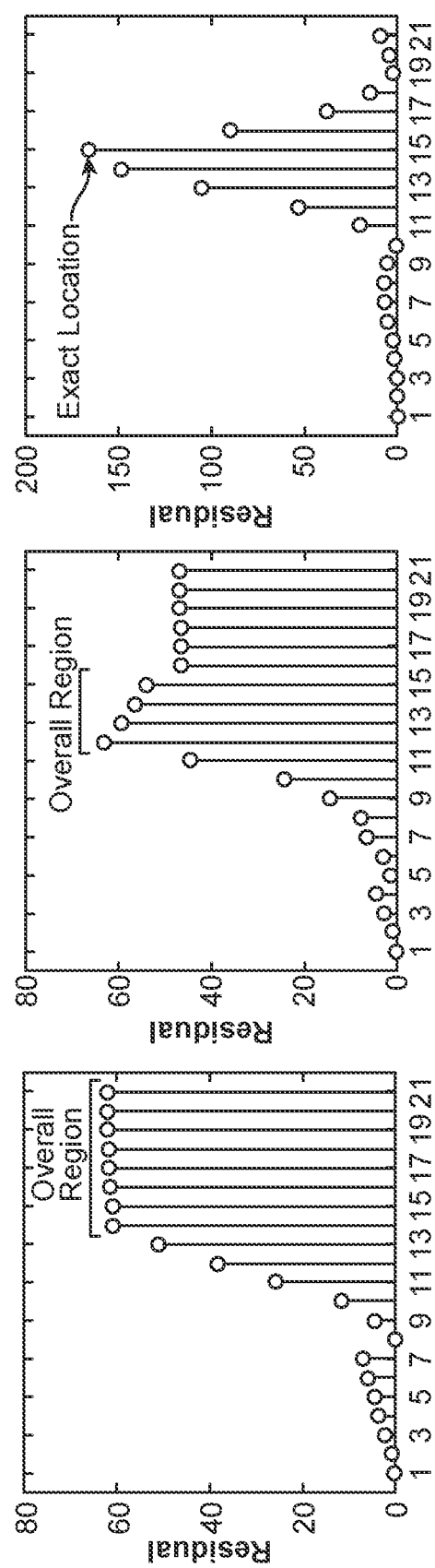
FIG. 22 is Table X, which illustrates performance for different event strengths and different measurement errors.
FIGS. 23(a)-23(c) illustrate results associated with a state estimation-based method, and wherein (a) two micro-PMUs installed at buses 7 and 14, (b) four micro-PMUs installed at buses 4, 8, 12, and 16, and (c) all buses equipped with micro-PMUs.

As for the method based on state estimation that is used for comparison, the location of an event is determined based on the residuals obtained from state estimation. The residuals show the difference between pre-event and post-event power injections at different buses. The bus with the highest residual, i.e., the highest power injection difference, is determined as the location of the event. The results obtained from the state estimation-based method are shown in FIG. 23(a). To consider a fair comparison, we assume that two micro-PMUs are installed at buses 7 and 14 to divide the buses into three equal groups, which appeared to work the best for the state estimation method with two micro-PMUs. In accordance with an exemplary embodiment, the highest residuals are associated with an array of buses from bus 15 to bus 21, which means that the state estimation-based method was able to only very roughly identify the overall region of the event, but not the actual location of the event.

The efficiency of the state estimation-based method is further appraised by increasing the number of micro-PMUs installations from two to four, at buses 4, 8, 12, and 16. The results are shown in FIG. 23(b). In accordance with an exemplary embodiment, the highest residuals are associated with buses 12, 13, 14, 15, i.e., those buses that are located in between the two micro-PMUs at buses 12 and 16. The state estimation-based method in this example can again loosely determine the overall region of the event, but not the exact location of the event. Ultimately, in order to precisely localize the event, all the buses are assumed to be equipped with micro-PMUs. The results are shown in FIG. 23(c). In contrast, the disclosed method can identify the location of the event with only two micro-PMUs.

Case Studies: Real-Life Network

Figure 24:
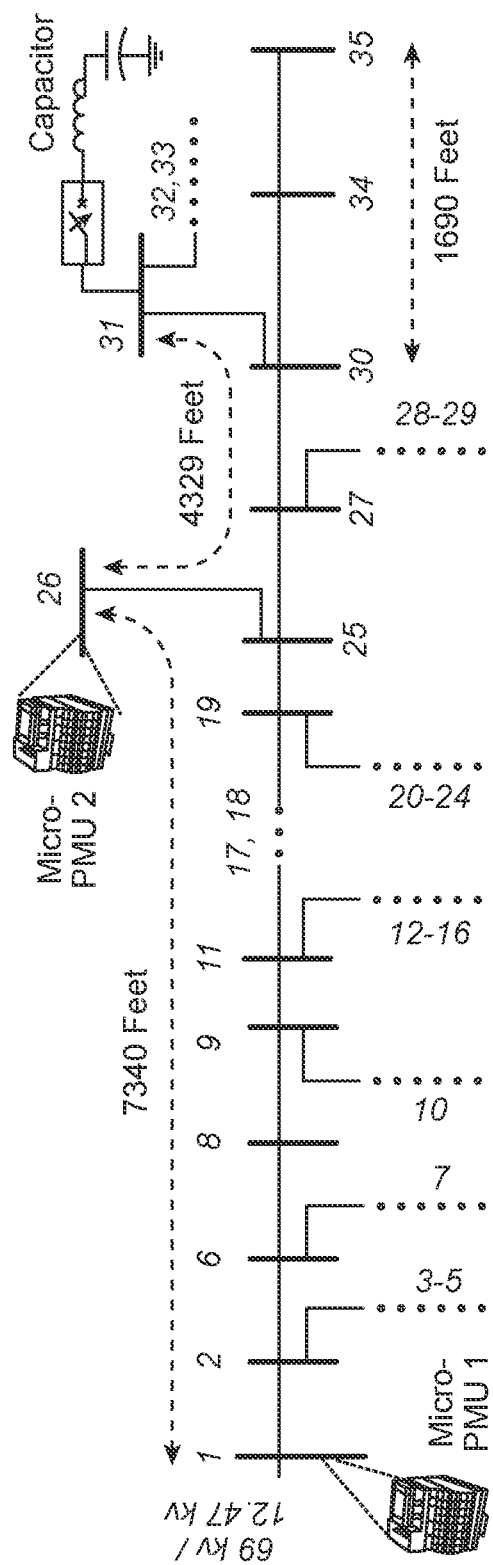
FIG. 24 illustrates a representation of a distribution feeder based on compensation theorem equivalent circuit, wherein the measurements are done by two micro-PMUs.
Figure 25A:
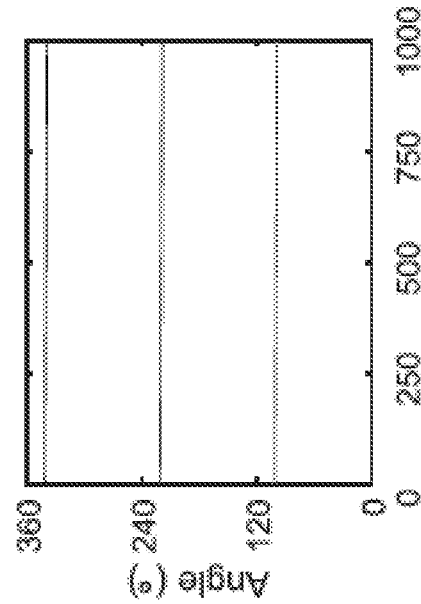
Figure 25B:
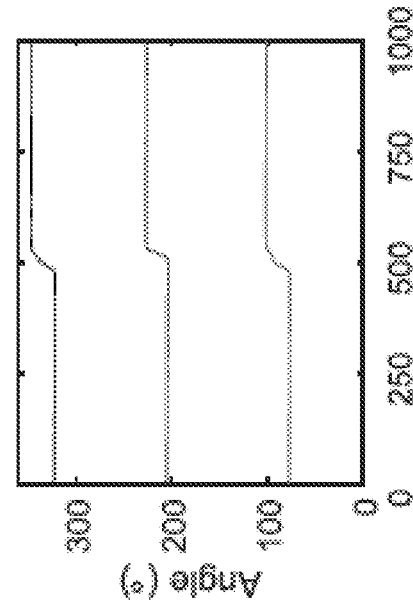
Figure 25C:
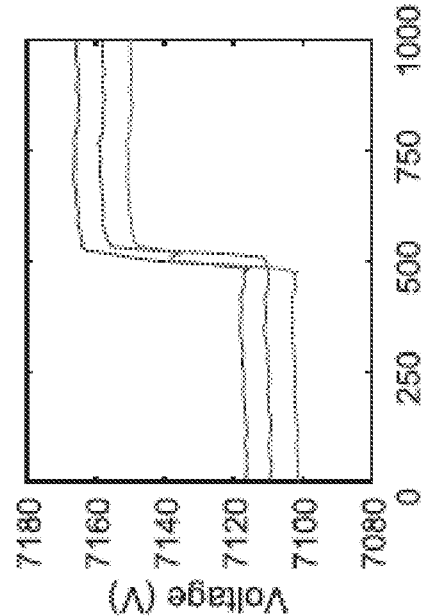
Figure 25D:
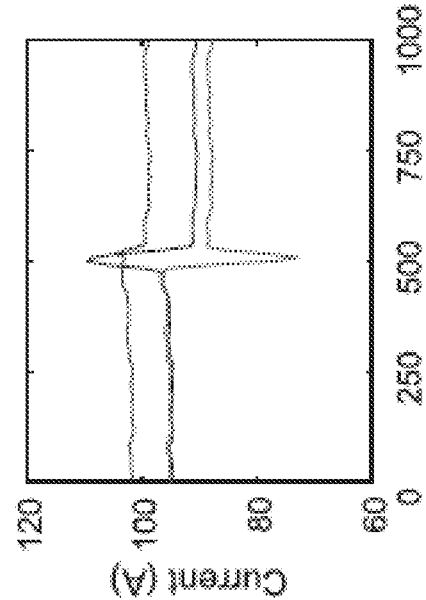

In this section, we evaluate the performance of our method using micro-PMU data from a real-life distribution feeder in Riverside, Calif. The schematic diagram of this feeder is shown in FIG. 24. This feeder is operated by Riverside Public Utilities (RPU), see www.riverside.ca.gov.

The under-study feeder includes multiple capacitor banks. On particular interest in this case study is a three-phase switched capacitor bank rated at 900 kVAR at bus 31, see FIG. 24. The capacitor bank is switched by a vacuum circuit breaker which is controlled by a Volt-VAR controller. This capacitor bank is not monitored by any sensor. Therefore, RPU is not aware of how the capacitor bank operates on a daily basis.

This feeder is also equipped with two micro-PMUs at buses 1 and 26. FIGS. 25(a)-25(h) show the voltage and current phasors that are measured by the two micro-PMUs during a capacitor bank switching on event. This event can be detected by looking into the changes in the power factor of the distribution feeder as seen by micro-PMU 1. However, other event detection methods may also be used.

Figures 26A, 26B:
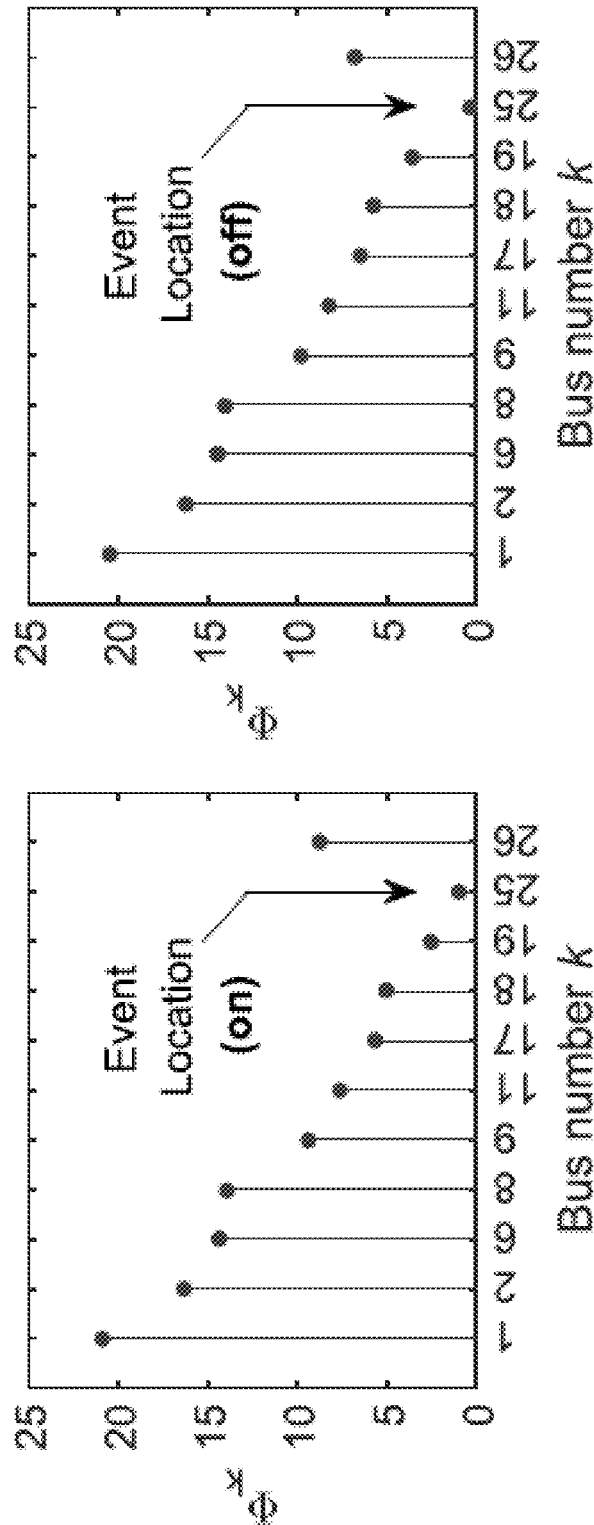
FIGS. 26(a)-26(b) illustrate results for identifying the location of capacitor bank switching events using real-world micro-PMU data, wherein (a) is switching ON, and (b) is switching OFF.

At first glance, the data from micro-PMU 2 does not seem to provide any additional information, other than mimicking the voltage magnitude at substation. However, the use of micro-PMU 2 is critical to obtain the location of the capacitor. The results are shown in FIG. 26(a), where the event source is located correctly. Here, the MST buses are 1, 2, 6, 8, 9, 11, 17, 18, 19, 25, and 26. Therefore, as far as the information available to the two micro-PMUs is concerned, the correct event source location is bus 25. Buses 27 to 35 are the laterals of MST bus 25. Therefore, the source of the event should be sought at these buses; or bus 25 itself. According to the further information regarding the extent and nature of the capacitor bank event, it can be concluded that a capacitor bank is switched at bus 31, because bus 31 is the only bus with a capacitor bank on this lateral. Of course, it would have been better for the purpose of the analysis in this disclosure if micro-PMU 2 was installed at bus 35, i.e., at the end of the lateral. In that case, the ESLI method would identify bus 30 as the event source location.

It is worth noting that if we use only the magnitudes but not the phase angles of the micro-PMU measurements, i.e., as in RMS sensors, then bus 19 would be identified as the event source location, which is incorrect. Therefore, it is necessary to use micro-PMUs as opposed to RMS-based sensors.

The ESLI method can correctly identify also the location of the capacitor bank switching off event, as shown in FIG. 26(b).

The potential limitation and challenges for the ESLI method implementation can be described as follows:

Significance of the Event: While the theory in this disclosure is valid regardless of the significance of the event; in practice, if the event is too small, for example, there is only a very minor change in impedance, then the location of the event may not be identified correctly due to the presence of measurement errors or lack of updated pseudo-measurements. In accordance with an exemplary embodiment, although, this limitation may not have major impact in practice, because if the event is indeed minor, then it may not be of interest to be scrutinized.

Number of Micro-PMUs: The method can precisely determine the location of events when they occur on MST buses; otherwise, the MST bus that is closest to the true event bus will be identified. In this regard, if all we need is to know the lateral where the event is located, then we can obtain the acceptable results by using only two micro-PMUs, one at the substation and one at the end of the feeder. However, if the exact location of the event on a lateral is important then we also need micro-PMU installations at the end of the laterals.

Pre-Event and Post-Event Stability: In accordance with an exemplary embodiment, the method as disclosed is intended to localize stable events. That is, for the method as disclosed to work properly, the network should be in its stable mode both before and after the event. This is because the method essentially uses steady-state pre-event and post-event measurements.

Changes in System Frequency: In practice, the system frequency often deviates from the nominal system frequency, e.g., 60 Hz in North America. If such deviations in frequency are significant, then they can potentially affect the estimated angle of phasor measurement. These changes for a short period of time follow a quasi-steady rate which is called the rate of change of frequency (ROCOF). Therefore, to find the true change in phase angle following an event, the ROCOF should be taken into account.

In accordance with an exemplary embodiment, a novel application of micro-PMUs is disclosed, based on an innovative use of the compensation theorem in circuit theory, to identify the location of events in power distribution systems. In accordance with an exemplary embodiment, at least two micro-PMUs must be installed in order to implement this method, one at the substation and another one at the end of the feeder. However, based on the importance of buses, additional micro-PMUs can be deployed at the end of laterals to make the buses on laterals observable. Simulation results on an IEEE 123 test system showed that the method can accurately estimate the exact location of different types of events, including power quality events, faults, as well as events that are benign yet they can reveal how different components operate across the feeder. Since the method is based on measurement differences, it has a reasonably robust performance with respect to measurement errors. The performance is robust also against errors in pseudo-measurements as well as in distribution lines impedances. The importance of using phase angle measurements was shown analytically and also through cases studies; thus, justifying the use of micro-PMUs as opposed to ordinary RMS-based voltage and current sensors. The effectiveness of the disclosed method is confirmed also by using micro-PMU measurements from a pilot real-life distribution feeder in Riverside, Calif.

For example, the polynomial load model is widely used in power system studies. This model consists of three main parts: constant-impedance, constant-current, and constant-power. Accordingly, the injection current at bus i can be described as:

$$I_i = I_i^Z + I_i^I + I_i^P, \quad (30)$$

where $I_i^Z$, $I_i^I$, and $I_i^S$ denote the injection current at bus i associated with the constant-impedance, constant-current, and constant-power load components, respectively. Once we replace the electrical model associated with each load component, we can rewrite (21) as:

$$I_i = Y_i V_i + C_i^I + \left(\frac{C_i^S}{V_i}\right)^*, \quad (31)$$

where $V_i$ is the voltage at bus i; and * denotes the conjugate operator. Parameters $Y_i$, $C_i^I$, and $C_i^S$, are associated with load admittance in the constant-impedance model, quantity of current in the constant-current model, and apparent power in the constant-power model. The variation of $I_i$ can now be expressed with respect to the variation of $V_i$:

$$\Delta I_i = Y_i \Delta V_i + C_i^{S*}\left(\frac{1}{V_i^{pre} + \Delta V_i} - \frac{1}{V_i^{pre}}\right)^*. \quad (32)$$

The above expression describes the relationship between $\Delta I_i$ and $\Delta V_i$ once all the load types are taken into account. Throughout the formulations in this disclosure, we use the constant-impedance model, where $\Delta I_i$ is obtained from the production $Y_i \Delta V_i$. As for the constant-power model, the deviation in injection current can be obtained from the second term in (32). For the constant-current model, the load has the same current before and after the change in the network. As a result, the injection current deviation derived from constant-current loads is zero, for example, constant-load model can be ignored.

Once all the load types are considered, the relationship in (32) can be integrated into the forward and backward nodal voltage calculations in (16) and (18), i.e., $\Delta I_i^f$ in (16) and $\Delta I_i^b$ in (18) can be obtained from (32). Of course, this will make (16) and (18) longer and more complicated to present. However, the updated formulations of (16) and (18) would be correct at all buses, except for bus k, in which the event occurs. Accordingly, the classification in (18) and the rest of the analysis will remain unchanged.

In accordance with an exemplary embodiment, the methods and processes as disclosed can be implemented on a non-transitory computer readable medium. The non-transitory computer readable medium may be a magnetic recording medium, a magneto-optic recording medium, or any other recording medium which will be developed in future, all of which can be considered applicable to the present invention in all the same way. Duplicates of such medium including primary and secondary duplicate products and others are considered equivalent to the above medium without doubt. Furthermore, even if an embodiment of the present invention is a combination of software and hardware, it does not deviate from the concept of the invention at all. The present invention may be implemented such that its software part has been written onto a recording medium in advance and will be read as required in operation.

It will be apparent to those skilled in the art that various modifications and variation can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for identifying a location of an event in a power distribution network, the method comprising:
   receiving voltage and current flowing downstream and upstream of a distribution feeder from at least two distribution-level phasor measurement units installed on the distribution feeder in the power distribution network;
   calculating changes in forward nodal voltages along the distribution feeder using measurements from at least one phasor measurement unit of the at least two distribution-level phasor measurement units;
   calculating changes in backward nodal voltages along the distribution feeder using the measurements from another phasor measurement unit of the at least two distribution-level phasor measurement units;
   comparing the calculated changes in the forward nodal voltages to the calculated changes in the backward nodal voltages; and
   determining the location of the event based on the comparison of the calculated changes in the forward nodal voltages to the calculated changes in the backward nodal voltages.

2. The method according to claim 1, comprising:
   installing one of the at least two distribution-level phasor measurement units at a substation; and
   installing another one of the at least two distribution-level phasor measurement units at an end of the distribution feeder.

3. The method according to claim 1, further comprising:
   confirming that the event occurred between the at least two distribution-level phasor measurement units by checking equivalent upstream admittances and equivalent downstream admittances calculated by the at least two distribution-level phasor measurement units.

4. The method according to claim 1, wherein the determination of the location of the event is determined based on a compensation theorem, and an assumption that the voltage and current at a beginning of an equivalent feeder and at the end of an equivalent feeder are essentially equal to the changes in voltages and currents that are recorded by the at least two distribution-level phasor measurement units.

5. The method according to claim 1, wherein
   the forward nodal voltage calculations are the changes in nodal voltages along the feeder calculated using measurements from the at least one phasor measurement unit of the at least two distribution-level phasor measurement units at a beginning of the distribution feeder; and
   the backward nodal voltage calculations are the changes in nodal voltages along the distribution feeder using the measurements from the at least one phasor measurement unit of the at least two distribution-level phasor measurement units at an end of the distribution feeder.

6. The method according to claim 1, wherein the distribution feeder includes a plurality of buses arranged across the distribution feeder and between the at least two distribution-level phasor measurement units, the method further comprising:
   calculating a discrepancy of nodal voltages obtained from calculations across the plurality of buses to identify a bus of the plurality of buses that corresponds to the location of the event.

7. The method according to claim 1, wherein the at least two distribution-level phasor measurement units are micro-phasor measurement units, the micro-phasor measurement units having a manufacturer-reported accuracy at 0.01% in magnitude and 0.003° in angle.

8. The method according to claim 1, comprising:
   using three or more micro-phasor measurement units in the distribution feeder, which includes one or more lateral feeders.

9. The method according to claim 1, wherein the event is a power quality event or an emergency event.

10. A non-transitory computer readable medium storing computer program code executed by a computer processor for identifying an event in a power distribution network, comprising:
    receiving voltage and current flowing downstream and upstream of a distribution feeder from at least two distribution-level phasor measurement units installed on the distribution feeder in the power distribution network;
    calculating changes in forward nodal voltages along the distribution feeder using measurements from at least one phasor measurement unit of the at least two distribution-level phasor measurement units;
    calculating changes in backward nodal voltages along the distribution feeder using the measurements from another phasor measurement unit of the at least two distribution-level phasor measurement units;

comparing the calculated changes in the forward nodal voltages to the calculated changes in the backward nodal voltages; and determining the location of the event based on the comparison of the calculated changes in the forward nodal voltages to the calculated changes in the backward nodal voltages.

11. The non-transitory computer readable medium according to claim 10, comprising:
installing one of the at least two distribution-level phasor measurement units at a substation; and
installing another one of the at least two distribution-level phasor measurement units at an end of the distribution feeder.

12. The non-transitory computer readable medium CRM according to claim 10, further comprising:
confirming that the event occurred between the at least two distribution-level phasor measurement units by checking equivalent upstream admittances and equivalent downstream admittances calculated by the at least two distribution-level phasor measurement units; and
wherein the determination of the location of the event is determined based on a compensation theorem, and an assumption that the voltage and current at a beginning of an equivalent feeder and at the end of an equivalent feeder are essentially equal to the changes in voltages and currents that are recorded by the at least two distribution-level phasor measurement units.

13. The non-transitory computer readable medium according to claim 10, wherein
the forward nodal voltage calculations are the changes in nodal voltages along the feeder calculated using measurements from the at least one phasor measurement unit of the at least two distribution-level phasor measurement units at a beginning of the distribution feeder; and
the backward nodal voltage calculations are the changes in nodal voltages along the distribution feeder using the measurements from the at least one phasor measurement unit of the at least two distribution-level phasor measurement units at an end of the distribution feeder.

14. A system for identifying a location of an event in a power distribution network, the system comprising:
at least two distribution-level phasor measurement units installed in the power distribution network on a distribution feeder; and
a processor configured to:
receive voltage and current flowing downstream and upstream of the distribution feeder from the at least two distribution-level phasor measurement units;
calculate changes in forward nodal voltages along the distribution feeder using measurements from at least one phasor measurement unit of the at least two distribution-level phasor measurement units;
calculate changes in backward nodal voltages along the distribution feeder using the measurements from another phasor measurement unit of the at least two distribution-level phasor measurement units;
compare the calculated changes in the forward nodal voltages to the calculated changes in the backward nodal voltages; and
determine the location of the event based on the comparison of the calculated changes in the forward nodal voltages to the calculated changes in the backward nodal voltages.

15. The system according to claim 14, wherein one of the at least two distribution-level phasor measurement units is installed at a substation, and another one of the at least two distribution-level phasor measurement units is installed at an end of the distribution feeder.

16. The system according to claim 14, wherein the processor is configured to:
confirm that the event occurred between the at least two distribution-level phasor measurement units by checking equivalent upstream admittances and equivalent downstream admittances calculated by the at least two distribution-level phasor measurement units.

17. The system according to claim 14, wherein the determination of the location of the event is determined based on a compensation theorem, and an assumption that the voltage and current at a beginning of an equivalent feeder and at the end of an equivalent feeder are essentially equal to the changes in voltages and currents that are recorded by the at least two distribution-level phasor measurement units.

18. The system according to claim 14, wherein,
the forward nodal voltage calculations are the changes in nodal voltages along the feeder calculated using measurements from the at least one phasor measurement unit of the at least two distribution-level phasor measurement units at a beginning of the distribution feeder;
the backward nodal voltage calculations are the changes in nodal voltages along the distribution feeder using the measurements from the at least one phasor measurement unit of the at least two distribution-level phasor measurement units at an end of the distribution feeder; and
wherein the distribution feeder includes a plurality of buses arranged across the distribution feeder and between the at least two distribution-level phasor measurement units, the processor configured to:
calculate a discrepancy of nodal voltages obtained from calculations across the plurality of buses to identify a bus of the plurality of buses that corresponds to the location of the event.

19. The system according to claim 14, wherein the at least two distribution-level phasor measurement units are micro-phasor measurement units, the micro-phasor measurement units having a manufacturer-reported accuracy at 0.01% in magnitude and 0.003° in angle.

20. The system according to claim 19, wherein the system includes three or more micro-phasor measurement units in the distribution feeder, which includes one or more lateral feeders.

* * * * *